(12) United States Patent
Pei et al.

(10) Patent No.: US 11,397,031 B2
(45) Date of Patent: Jul. 26, 2022

(54) ELECTROCALORIC COOLING WITH ELECTROSTATIC ACTUATION

(71) Applicant: The Regents of the University of California, Oakland, CA (US)

(72) Inventors: Qibing Pei, Calabasas, CA (US); Rujun Ma, Los Angeles, CA (US); Ziyang Zhang, Los Angeles, CA (US); Roy Kornbluh, Palo Alto, CA (US); David Huber, Palo Alto, CA (US)

(73) Assignees: THE REGENTS OF THE UNIVERSITY OF CALIFORNIA, Oakland, CA (US); SRI INTERNATIONAL, Menlo Park, CA (US)

( * ) Notice: Subject to any disclaimer, the term of this patent is extended or adjusted under 35 U.S.C. 154(b) by 85 days.

(21) Appl. No.: 16/610,838

(22) PCT Filed: May 7, 2018

(86) PCT No.: PCT/US2018/031410
§ 371 (c)(1),
(2) Date: Nov. 4, 2019

(87) PCT Pub. No.: WO2018/208680
PCT Pub. Date: Nov. 15, 2018

(65) Prior Publication Data
US 2021/0071917 A1    Mar. 11, 2021

Related U.S. Application Data

(60) Provisional application No. 62/502,251, filed on May 5, 2017.

(51) Int. Cl.
*F25B 21/00*    (2006.01)
*H01L 37/02*    (2006.01)

(52) U.S. Cl.
CPC ............ *F25B 21/00* (2013.01); *H01L 37/025* (2013.01); *F25B 2321/001* (2013.01)

(58) Field of Classification Search
CPC ........................... F25B 21/00; F25B 2321/001
See application file for complete search history.

(56) References Cited

U.S. PATENT DOCUMENTS 7,787,254 B2 *   8/2010   Clayton .............. H01L 23/5387
                                                           361/749
8,695,353 B2 *   4/2014   Casasanta ............... F25B 21/00
                                                           62/3.1

(Continued)

FOREIGN PATENT DOCUMENTS

WO         2011075335         6/2011

OTHER PUBLICATIONS

PCT International Search Report & Written Opinion dated Oct. 17, 2018, International Application No. PCT/US18/31410.

*Primary Examiner* — Ana M Vazquez
(74) *Attorney, Agent, or Firm* — Gates & Cooper LLP

(57) ABSTRACT

A solid-state heat transporting device including a heat transporting element whose uniformity of contact with one or multiple surfaces is controllable so that various amounts of heat may be transported to and from the one or multiple surfaces. The heat transporting element uses the electrocaloric effect to absorb and release the heat and the uniformity of contact is controlled using an electrostatic effect which may change the shape of the heat transporting element. In one embodiment, the heat transporting element is an electrostatically actuated P(VDF-TrFE-CFE) polymer stack achieving a high specific cooling power of 2.8 W/g and a COP of 13 (the highest reported coefficient of performance to date) when used as a cooling device.

18 Claims, 20 Drawing Sheets

(56) References Cited

U.S. PATENT DOCUMENTS

| | | | |
|---|---|---|---|
| 10,125,758 B2* | 11/2018 | Ducharme | F16K 99/0049 |
| 2014/0034529 A1 | 2/2014 | McGuire et al. | |
| 2015/0208498 A1* | 7/2015 | Poon | H05K 1/092 |
| | | | 361/748 |
| 2017/0030529 A1 | 2/2017 | Bergmann et al. | |

* cited by examiner

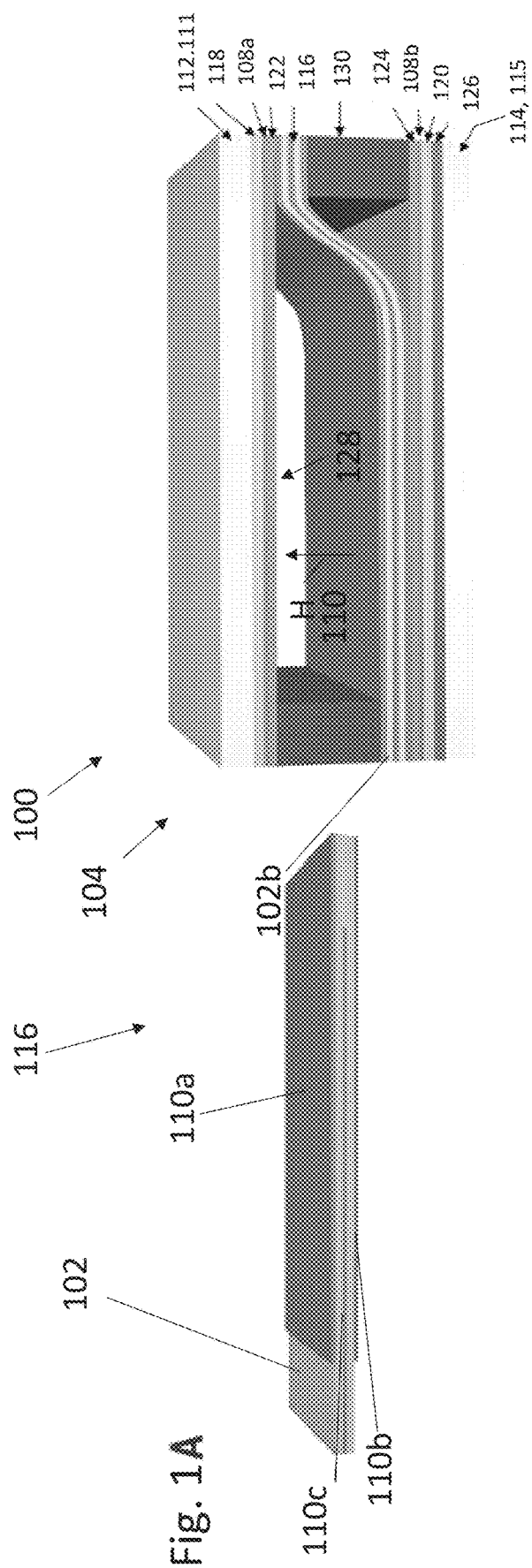

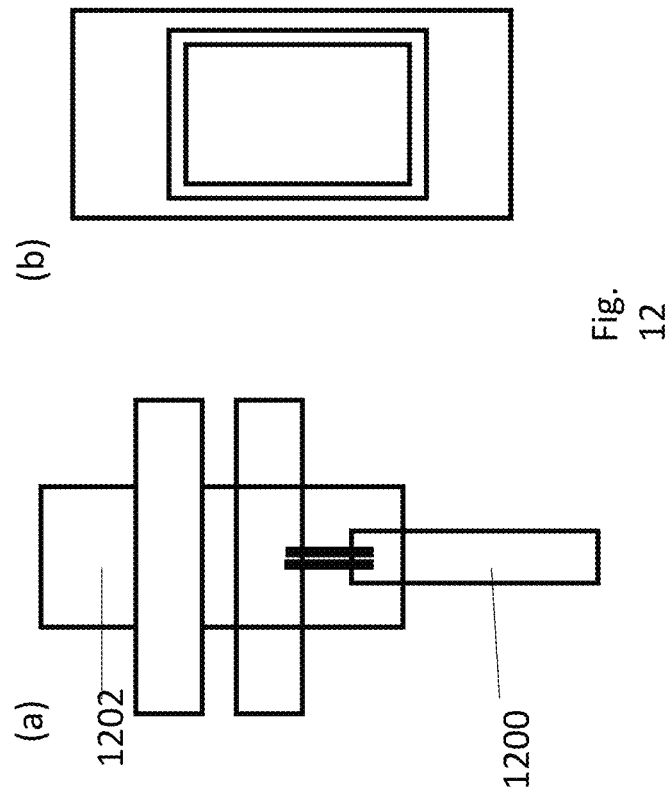
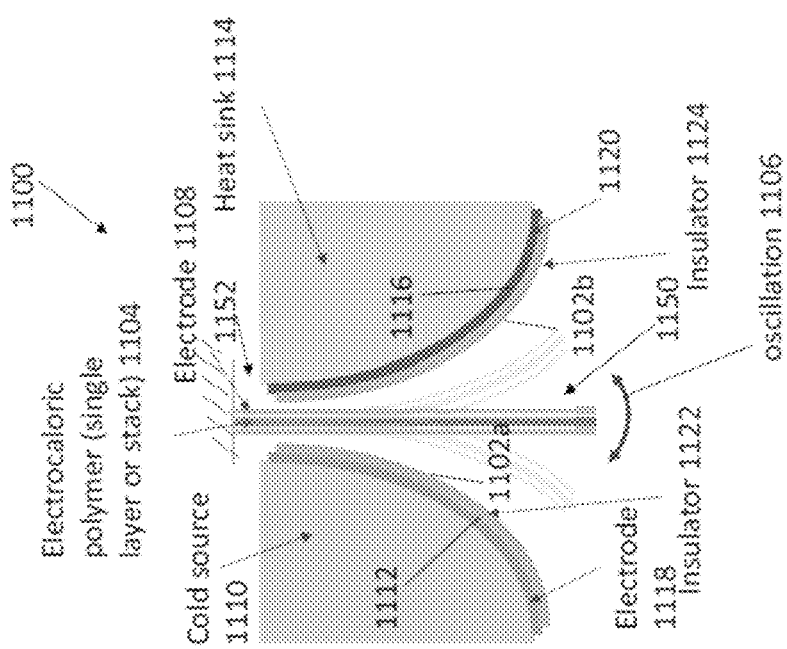
Fig. 12
Fig. 11

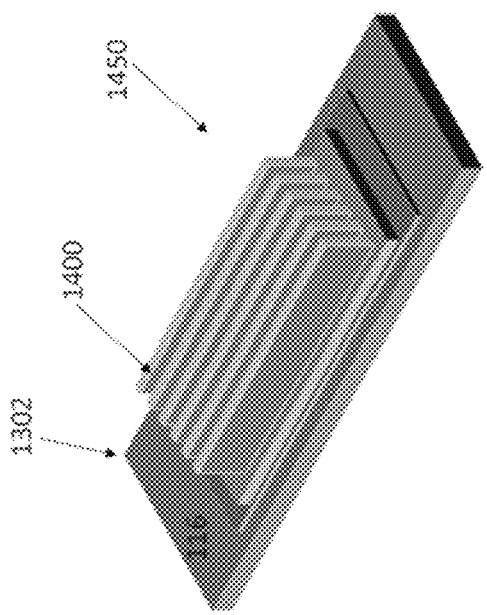
Fig. 14
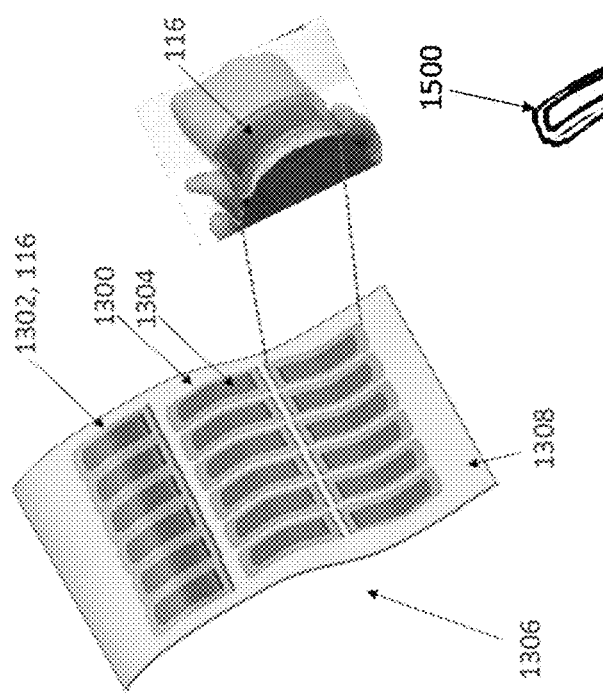
Fig. 15
Fig. 13

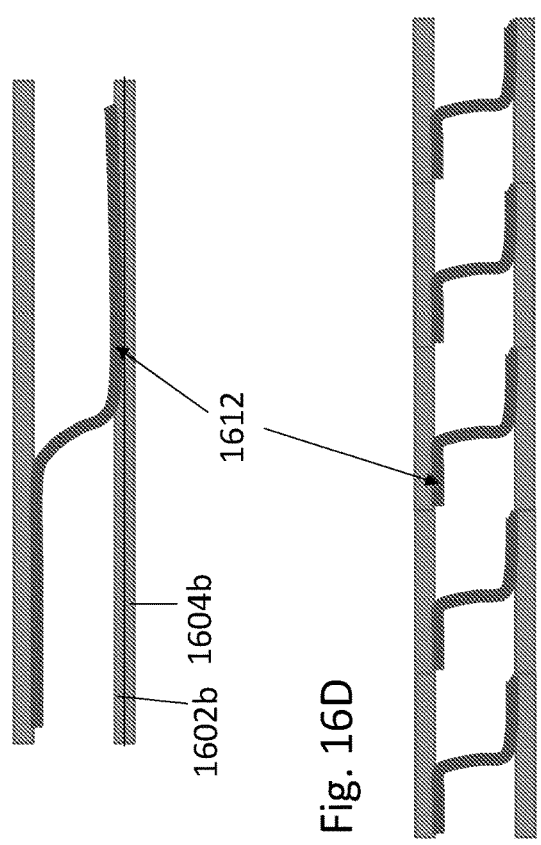
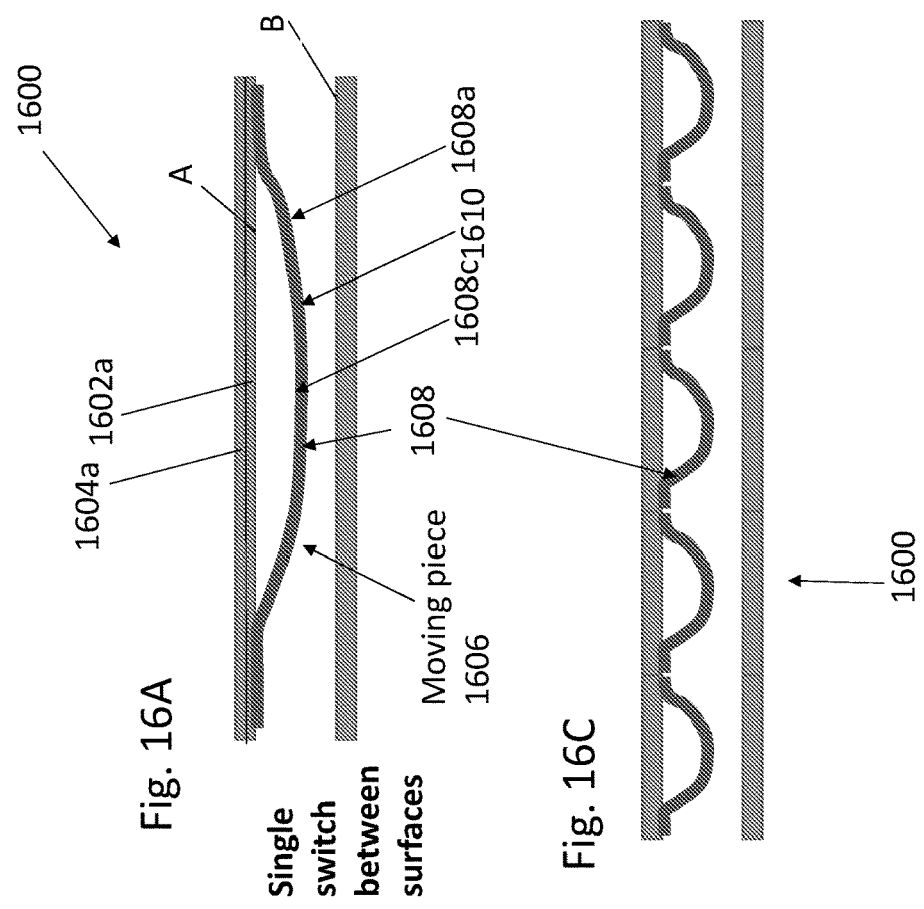

ELECTROCALORIC COOLING WITH ELECTROSTATIC ACTUATION

CROSS REFERENCE TO RELATED APPLICATIONS

This application claims the benefit under 35 U.S.C. Section 119(e) of and commonly-assigned U.S. Provisional Patent Application Ser. No. 62/502,251, filed on May 5, 2017 by Qibing Pei, Rujun Ma, Ziyang Zhang, Roy Kornbluh, and David Huber, entitled "ELECTROCALORIC COOLING WITH ELECTROSTATIC ACTUATION," client reference number 2017-646, which application is incorporated by reference herein.

STATEMENT REGARDING FEDERALLY SPONSORED RESEARCH AND DEVELOPMENT

This invention was made with Government support under DE-AR0000532, awarded by the U.S. Department of Energy, and FA9550-12-1-0074, awarded by the U.S. Air Force, Office of Scientific Research. The Government has certain rights in the invention.

TECHNICAL FIELD

This invention relates to devices for transporting heat including, but not limited to, heating and cooling systems.

BACKGROUND OF THE INVENTION

Vapor-compression refrigeration systems, commonly used in air-conditioners for buildings and automobiles, refrigerators for food storage, and processing plants, rely on the phase change of refrigerants driven by mechanical compressors, a technology developed over two centuries ago. While effective for many applications, vapor-compression systems have their disadvantages. They are bulky, complex, and difficult to scale down to meet the cooling demands of modern technologies, such as mobile devices, wearable electronics, and flexible electronics. The coefficient of performance (COP), the amount of heat removed per electrical energy consumed, is also low, typically 2-4 for vapor compression refrigerators. (1,2) Existing refrigerants also have high global warming potentials, and present an environmental risk upon leaking or improper disposal.

Solid-state cooling systems are more recent alternatives that do away with the need for compressors and refrigerants. Thermoelectric coolers based on the Peltier effect produced in bismuth antimony telluride have found a number of applications. However, these systems typically exhibit a COP even lower than that of vapor-compression refrigeration systems. (4) Further, the ceramic materials tend to be expensive, restricting their use to small-scale applications. Solid state refrigeration based on the electrocaloric (EC) effect has been proposed as a more efficient alternative that can also be used to realize compact low-profile devices. (2,6-8) The EC effect is a thermodynamic phenomenon where a reversible temperature change of a dielectric material is achieved by the modulation of its dipolar entropy under an applied electric field (See FIG. 6). (7).

Current EC materials such as relaxor ferroelectric ceramics (6) and polymers (7) have shown promising material properties. Lead zirconium titanate ($PbZr_{0.95}Ti_{10.05}O_3$) exhibits a large adiabatic temperature change ($\Delta T$) of 12° C. at 226° C. with an associated theoretical maximum heat removal of 4 J/g. (6) Various poly(vinylidenefluoride) (PVDF)-based ferroelectric polymers have been investigated with increasing interest due to their large isothermal entropy change, light weight, and adaptability to complex form factors and low temperature processing conditions. Among this class of polymers, poly(vinylidenefluoride-ter-trifluoroethylene-ter-chlorofluoroethylene) (P(VDF-TrFE-CFE)) has been reported with an calculated $\Delta T$ of 12° C. at 55° C. (7) corresponding to a maximum heat removal density of 18.4 J/g. Nanocomposites comprised of either P(VDF-TrFE-CFE) or (P(VDF-TrFE)) with nanosized Boron Nitride or other ceramics have also been reported with similarly high EC performance. (8)

Even though numerous publications have reported high material-level performances, the realization of functional solid-state cooling devices based on the EC effect remains a major challenge. Among the reported EC cooling devices, (9-15) there is no experimentally obtained COP data. The highest reported specific cooling power of 0.018 W/g (15) is still orders of magnitude smaller than the theoretically calculated values based on intrinsic material properties.

One practical challenge of implementing EC cooling devices stems from the fact that electrocaloric materials need to be physically transported between a heat sink and the heat source in sync with the application and removal of electric fields. An electric motor and transmission may be used, but such a design lowers the COP and increases the size and overall complexity of the system.

SUMMARY OF THE INVENTION

The present disclosure describes solid state heat transporting devices comprising a heat transporting element whose uniformity of contact with one or multiple surfaces is controllable so that various amounts of heat may be transported to and from the one or multiple surfaces. The heat transporting element uses the electrocaloric effect to absorb and release the heat and the uniformity of contact is controlled using an electrostatic effect which may change the shape or position of the heat transporting element. The solid-state heat transporting device may be conformable to a flat or a non-flat surface and controllably increases (or decreases) thermal contact and heat flux between the device and the surface(s). In various examples, the heat transporting element(s) are incorporated into tiles used to cover and conform to various surfaces.

In one embodiment, the solid-state cooling device includes a flexible electrocaloric (EC) polymer film coupled to an electrostatic actuation mechanism such that the flexible EC polymer film transfers heat between a heat source and a heat sink. Reversible electrostatic forces generated by the electrostatic actuation mechanism reduce parasitic power consumption and allow efficient heat transfer through (e.g., instantaneous) formation of good thermal contacts with the heat source and/or heat sink. As demonstrated herein, an illustrative compact solid state refrigeration system including the cooling device has a flexible form factor while at the same time achieving surprisingly high specific cooling power (2.8 W/g) and coefficient of performance (COP), thereby leapfrogging the performance of existing solid-state cooling technologies. Moreover, such a combination of compactness, mechanical flexibility and high intrinsic thermodynamic efficiency is highly desirable for a wide range of applications including, but not limited to, applications where efficient and localized heat transfer is required.

In another embodiment, the heat transporting element is used as a switch that is electrostatically controlled to create or eliminate thermal contact between two surfaces.

The heat transporting device or system can be embodied in many ways, including but not limited to, the following:

1. The device including a solid state cooling device comprising a flexible EC material (e.g., film); and an actuation mechanism coupled to the flexible EC film. The actuation mechanism bends the flexible EC film between a first thermal contact with a heat sink and a second thermal contact with a heat source, so as to transfer heat H between the heat source and the heat sink.

2. The device of embodiment 1, wherein the actuation mechanism includes one or more flexible electrodes attached to the flexible EC film, a first electrode attached to the heat sink, and a second electrode attached to the heat source. The flexible EC film bends when the actuation mechanism applies an actuation field between one or more of the flexible electrodes and the first electrode or between the one or more flexible electrodes and the second electrode, the flexible EC film heats up through an electrocaloric effect to form a temperature gradient between the heat sink and the flexible EC film when an electric field is applied across at least a portion of the flexible EC film, and heat inputted into the flexible EC film through the second thermal contact, flows to the heat sink under the temperature gradient and through the first thermal contact.

3. The device of one or any combination of embodiments 1-2, wherein the flexible EC film is attached between a pair of flexible electrodes and an electric field is applied between the pair of the flexible electrodes.

4. The device of one or any combination of embodiments 1-3, further including the circuit controlling timing of the electric field with respect to the actuation field Eact such that the flexible EC film oscillates between the first thermal contact and the second thermal contact, the flexible EC film heats up through the electrocaloric effect when the flexible EC film has the first thermal contact with the heat sink and the flexible EC film cools down when the flexible EC film has the second thermal contact with the heat source.

5. The device of one or any combination of the preceding embodiments 1-4, wherein the flexible EC film has a thickness T in a range of 1-1000 micrometers, the flexible EC film has an active surface area A in a range of 5 mm by 5 mm to 10 cm by 10 cm, the actuation field Eact comprises an electric field having a frequency in a range of 0.01 Hz—10 Hz and a magnitude below a breakdown field of the EC polymer film, and the device has specific cooling power of at least 2.8 W/g and a coefficient of performance (COP) of at least 13.

6. The device of one or any combination of the embodiments 1-5, wherein one or more of the electrodes comprise nanowires having a diameter in a range of 1-100 nm.

7. The device of one or any combination of the embodiments 1-6, wherein one or more of the electrodes include nanowires comprising carbon nanotubes, metal nanowires, or a combination thereof.

8. The device of one or any combination of the embodiments 1-7, wherein the flexible electrodes comprise nanowires embedded in the flexible EC film.

9. The device of one or any combination of the embodiments 1-8, wherein the flexible EC film comprises a polymer.

10. The device of one or any combination of the embodiments 1-9, wherein the flexible EC film comprises Vinylidene fluoride-trifluoroethylene-chlorofluoroethylene terpolymer (P(VDF-TrFE-CFE)).

11. The device of one or any combination of the embodiments 1-10, wherein the flexible EC film has a crystallinity characterized by a peak having a FWHM of less than 1 degree as measured by X-ray diffraction.

12. A switch, comprising a first electrode coupled to a first surface; a flexible structure thermally contacting the first surface, the flexible structure comprising a flexible electrode on a thermally conductive material; a second electrode coupled to a second surface, wherein the flexible structure bends to thermally contact the second surface when a potential difference is applied between the flexible electrode and the second electrode, and the flexible structure bends so as to release from the second surface when a potential difference is applied between the first electrode 1604a and the flexible electrode.

13. The switch of embodiment 12, wherein the thermally conductive material comprises graphene, graphene oxide, carbon nanotubes, boron nitride, nanoparticles of boron nitride, graphite, nanoparticles of graphite, nanoparticles of a metal, and/or crystalline polymer fibers.

14. The switch of embodiment 12, wherein the thermally conductive material 1608 comprises nanoparticles such as nanocrystals, nanofibers, nanowires, nanoribbons, and nanoflowers.

15. The switch of one or any combination of embodiments 12-14 combined with the device of one or any combination of embodiments 1-11, wherein the actuation mechanism of one or any combination of embodiments 1-11 includes the first electrode, the flexible structure, and the second electrode of one or any combination of embodiments 12-14.

16. A solid-state heat transporting device comprising a heat transporting element whose uniformity of contact with one or multiple surfaces is controllable so that various amounts of heat may be transported to and/or from the one or multiple surfaces.

17. The device of embodiment 16, wherein the heat transporting element, comprises an electrocaloric material that absorbs or releases the heat as a function of an electric field applied across the electrocaloric material.

18. The device of one or any combination of the embodiments 16-17, further including an electrode on the heat transporting element, wherein the uniformity of contact is controlled using an electrostatic force generated between one of the surfaces and the heat transporting element when an electrostatic field is applied between the electrode and the one of the surfaces.

19. The device of one or any combination of the embodiments 16-18, wherein the electrostatic force changes a shape of the heat transporting element.

20. The device of one or any combination of the embodiments 16-19, wherein the solid-state heat transporting device is conformable to a flat surface or a non-flat surface.

21. The device of one or any combination of the embodiments 16-20, further comprising an electrode 1610 on the heat transporting element, wherein the heat transporting element 1608a creates or eliminates thermal contact between two of the multiple surfaces when the heat transporting element is electrostatically controlled using the electrode.

22. The device of one or any combination the embodiments 16-21, wherein the heat transporting element is an EC film.

23. A heat transporting system comprising tiles each including a heat transporting element or member of one or any combination of embodiments 16-22. The heat transporting element has a uniformity of contact with one or multiple surfaces that is controllable so that various amounts of heat may be transported to and/or from the one or multiple surfaces. One or more of the tiles cover and conform to one or more of the surfaces.

24. The device of one or any combination of the embodiments 16-23 combined with one or any combination of embodiments 1-11. The heat transporting element or member is the flexible EC film and the heat transporting element is coupled to the actuation mechanism of one or any combination of embodiments 1-11.

25. The device of one or any combination of the embodiments 16-23 combined with one or any combination of embodiments 12-15, wherein the heat transporting element comprises the thermally conductive material of one or any combination of elements 12-15.

BRIEF DESCRIPTION OF THE DRAWINGS

Referring now to the drawings in which like reference numbers represent corresponding parts throughout:

FIGS. 1A-1D. A solid-state EC cooling device. FIG. 1A shows a schematic illustration of the EC polymer stack and FIG. 1B shows a solid state cooling device (not to scale). FIG. 1C is a photograph of a freestanding two-layer P(VDF-TrFE-CFE) stack with CNTs electrodes. FIG. 1D. IR thermal images of the P(VDF-TrFE-CFE) film (not in contact with either the heat source or heat sink) following application and removal of a 58.3 megavolts per meter (MV/m) electric field.

FIG. 3A is a schematic diagram of the working mechanism of the P(VDF-TrFE-CFE) cooling device. The electrostatic field drives the actuation of the EC polymer stack towards the heat sink or heat source and the respective displacement of the EC polymer film during operation of the device. By correlating the electric field of the EC polymer stack with the electrocaloric cycle, heat transfer from the heat source to the heat sink can be achieved. FIG. 3B is a time domain illustration of the cooling cycle.

FIG. 4A: Current draw of the EC film in response to an electric field across the electrocaloric polymer stack that has a maximum of 66.7 MV/m. FIG. 4B: Comparison of the heat flux measured by the heat flux sensor in both heating and cooling modes with a maximum applied electric field of 50 MV/m at a frequency of 0.06 Hz. FIG. 4C: Cyclic testing of the heat transport from the heat source to the EC polymer stack with a maximum applied electric field of 50 MV/m at a frequency of 0.06 Hz. FIG. 4D: Heat flux as a function of different frequencies of operation. Simulation results, which were obtained by numerically solving the transient heat conduction equation using the finite volume method, agree well with the experimental value. FIG. 4E: Heat flux from the EC polymer film as a function of different applied electric field at 0.8 Hz. FIG. 4F: Specific cooling power with corresponding COP is compared with those of control magnetocaloric and elastocaloric devices.

FIG. 5A is a photograph of flexible EC device. FIG. 5B shows the temperature change of overheated smartphone battery with and without the EC cooling device. The inset is the overheated battery on the top of the EC device.

FIG. 11 illustrates an alternative to S-shaped actuation wherein curved surfaces ensure good thermal contact when a flexible electrocaloric polymer layer is electrostatically attracted to the surface and oscillates back and forth between the curved surfaces.

FIGS. 12(a)-(b) illustrate a single-sided example (air is the other side) wherein a wooden tongue depressor provides the mass needed to stretch the EC film and ensure good contact when the electrostatic forces are applied and released.

FIG. 13 illustrates tiling individual EC heat pumps to achieve surface conformation, redundancy, and increased reliability.

FIG. 14 illustrates an interfacial material or spreader (straight, curved, or flexible) interfacing with a heat sink and that can be added to one or both sides of each heat pump tile. In this embodiment, a heat sink sinks the heat to the air and heat provided to and from outside of the device.

FIG. 15 illustrates an example wherein the EC heat pumps are stacked to create larger temperature gradients.

FIGS. 16A-16D illustrate a controllable thermal conductivity switching system comprising a thermally conductive material moving between two surfaces. FIGS. 16A-16B illustrate operation of a device including a single switch, and FIGS. 16C-16D illustrate operation of multiple switches. FIGS. 16A and 16C illustrate the low thermal conductivity state, and FIGS. 16B and 16D illustrate the high thermal conductivity state. A high thermal conductivity material is a substrate of the element that is moved and attached using electrostatics (each surface has an electrode and at least one surface is a surface of an insulating or semi-conducting dielectric layer). Electrostatics forms low-resistance interface with surface materials.

DETAILED DESCRIPTION OF THE INVENTION

Figure 1D:
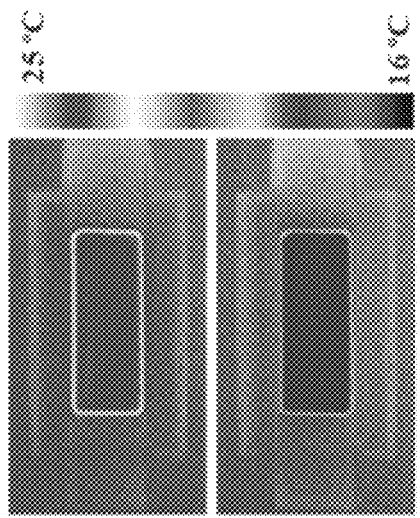

In the detailed description of the invention, references may be made to the accompanying drawings which form a part hereof, and in which is shown by way of illustration specific embodiments in which the invention may be practiced. It is to be understood that other embodiments may be utilized and structural changes may be made without departing from the scope of the present invention. A number of different publications are also referenced herein as indicated throughout the specification. A list of these different publications can be found below in the section entitled "REFERENCES". All publications, patents, and patent applications cited herein are hereby incorporated by reference in their entirety for all purposes.

Unless otherwise defined, all terms of art, notations and other scientific terms or terminology used herein are intended to have the meanings commonly understood by those of skill in the art to which this invention pertains. In some cases, terms with commonly understood meanings are defined herein for clarity and/or for ready reference, and the inclusion of such definitions herein should not necessarily be construed to represent a substantial difference over what is generally understood in the art. Many of the techniques and procedures described or referenced herein are generally well understood and commonly employed using conventional methodology by those skilled in the art. As appropriate, procedures involving the use of commercially available kits and reagents are generally carried out in accordance with manufacturer defined protocols and/or parameters unless otherwise noted.

First Embodiment: Cooling Device

The present disclosure describes an EC refrigeration device architecture where electrostatic actuation is employed to (e.g., rapidly) transport a flexible EC polymer film or stack between a heat source and a heat sink. The electrostatic force not only moves the EC material but promotes the formation of (e.g., intimate) thermal contact between the EC polymer film or stack and the heat source/sink during each cycle.

1. First Example a. Architecture and Fabrication

FIGS. 1A-1D illustrate the architecture of an EC cooling device 100 according to one example, comprising one or more heat transporting elements 102 and an actuation mechanism 104 attached to, coupled to, or on the heat transporting element(s). The heat transporting element(s) 102 each comprise a layer 102b of electrocaloric material or polymer and the actuation mechanism includes a first electrode layer 108a, and a second electrode layer 108b, and one or more flexible electrode layers 110. The first electrode layer 108a is attached to a heat sink 111 or through a plate 112 to the heat sink 111, the second electrode layer 108b is attached to a heat source 115 or through plate 114 to the heat sink 115, and the one or more flexible electrode layers 110 are attached to the one or more heat transporting elements (102).

In one or more examples, the heat transporting elements 102 and flexible electrode layers 108c are disposed in a stack 116 comprising alternating heat transporting element layers 102b and flexible electrode layers 110 (e.g., 3 flexible electrode layers 110a, 110b, 110c and two heat transporting element layers 102b, as illustrated in FIG. 1B). In other embodiments, a single heat transporting layer or element 102 is attached and electrically connected to a plurality (e.g., 3) different flexible electrode layers 110a, 110b, 110c at different locations, surfaces, or regions of the heat transporting layer or element 102 and such that the flexible electrode layers 110a, 110b, 110c can each be biased at different electrical potentials or voltages. The flexible electrode layers 110a, 110b, 110c can be embedded in the heat transporting layer or element 102.

In the example of FIG. 1B, the heat sink comprises or is connected to a metal plate (e.g., Al plate), the heat source comprises or is connected a metal plate (e.g., Al plate), the first electrode 108a comprises a layer of nanowires (e.g., silver (Ag) nanowires), and the second electrode 108b comprises a layer of Ag nanowires. The device 100 further includes a first adhesive layer 118 (e.g., double sided Kapton tape) attaching the first electrode to the heat sink and a second adhesive layer 120 (e.g., double sided Kapton tape) attaching the second electrode to the heat source. The device 100 further includes a first dielectric layer or first insulator layer 122 (e.g., polyimide film) on the first electrode 108a and a second dielectric layer or second insulator layer 124 (e.g., polyimide film) on the second electrode 108b. The device 100 further includes a heat flux sensor 126 between the metal plate of the heat source and the second electrode layer 108b.

It should be noted that the heat source and heat sink are not limited to thin aluminum sheets. In fact, a heat source and heat sink may be separate from the pumping device itself. For example, a heat source may commonly be a warm solid surface, a warm liquid or even a warm flowing gas. Similarly, the heat sink may also be a warm solid surface, a warm liquid or even a warm flowing gas. In this case we may think of the elements (aluminum plates 112, 114) designated as the heat sink and heat source in FIG. 1B as a thermal interface layer or spreader. This layer 112, 114 may be comprised of materials such as graphite sheets or carbon or metal-loaded polymers or other materials that are well-known to provide heat spreading (evening out the heat flow in the planar direction) or good thermal contact. In order to improve the heat transfer between the heat source or sink it is also common to include fins, pins or other well-known means of increasing the area of thermal contact, particularly in the case where the heat source or sink is a liquid or gas. It is also well-known that providing active flow, such as with a fan or pump, over these surfaces improves the heat transfer. In one or more examples, the motion of the electrocaloric material from the electrostatic forces can also provide a pumping effect in some cases if the solid sheets on the top and bottom of the heat pump device contain small holes to allow for the motion of air (or in the case of insulating liquids, a liquid).

The heat transporting element's uniformity of contact with one or multiple surfaces 128 is controllable so that various amounts of heat H may be transported to and from the one or multiple surfaces 128. Also shown is a spacer 130 (in this example, comprising PMMA) fixed to one end of the stack 116 and wherein the spacer 130 is fixed to the insulator layers 122, 124.

P(VDF-TrFE-CFE) is selected as the active EC material due to its large entropy change, large $\Delta T$ near room temperature, and mechanical flexibility. (7) Single-walled carbon nanotubes (CNTs) are used to form the electrodes of the EC film due to their mechanical compliance, thermal stability, and oxidation resistance. (27-28).

The device was fabricated as follows. The P(VDF-TrFE-CFE) solution was drop-cast onto a glass substrate, and the resulting polymer film was annealed at 90° C. A dispersion of CNTs in an isopropyl alcohol and water mixture was spray-coated onto the polymer film. One of the as-prepared films was laminated directly on top of another with only one CNT layer sandwiched between the EC films. The overlap of the CNT areas across the polymer films defined the active area ($2 \times 5$ cm$^2$) for the EC effect. The bottom surface of the stack was also spray-coated with CNTs to complete the fabrication of a two layer EC polymer stack: CNT/P(VDF-TrFE-CFE)/CNT/P(VDF-TrFE-CFE)/CNT with a total thickness of 60 μm. The EC laminate was then placed in a vacuum oven at 120° C. for 16 h to remove the residual solvent and to raise the degree of crystallinity (see FIG. 7) and thereby enhance the polarizability of the polymer.

The EC cooling device comprises two laminate sheets 7 cm×3 cm in area separated by a 6 mm thick spacer made of Poly(methyl methacrylate). Each laminate sheet consists of a double-sided Kapton™ tape, a polyimide film, and a silver nanowire percolation network layer inserted in between. The nanowire percolation layer serves as one electrode of the electrostatic actuator. The EC polymer stack is mounted on one end between the left spacer and the lower laminate, with the other end between the right spacer and the upper laminate as illustrated in FIG. 1A.

For testing convenience, a 6.3 mm thick aluminum plate was attached to the outer sticky surface of each of the Kapton™ tape. The plate acts as the heat source and sink, respectively. A heat flux sensor was inserted between the aluminum plate heat source and the Kapton™ tape for in-situ thermal measurement. The EC polymer stack forms an S-shape in its cross-sectional view. The stationary ends of the S-shaped film allow the film to make good thermal contact with the electrodes of the top or bottom aluminum plate. (30)

As demonstrated herein, the architecture described above forms a compact solid-state cooling device measuring 7 cm×3 cm×0.5 cm that achieves a COP of 13 at a heat flux of 29.7 mW/cm². This heat flux corresponds to a specific cooling power of 2.8 W/g, which is the highest reported value of solid state refrigeration to date. The previous record had a COP of only 1.9 and a specific cooling power of 2 W/g. (17) The thin-film EC cooling device is flexible and can conform to curvilinear surfaces. It also operates without the noise and complexity of a conventional cooling system.

b. Principle of operation

The S-shaped EC film is driven by electrostatic forces when a voltage is applied between one of the silver nanowire layers in the heat sink/heat source and the corresponding outer CNT layer on the EC stack facing the silver nanowire layer. Thus, during operation, the S-shaped EC film moves up and down like a flexure spring. Because of its light weight and low bending stiffness, the EC film stack could be shuttled rapidly between attachment to the upper and lower laminates with a response time less than 30 ms and total energy consumption of only~0.02 W. This electrostatic actuation is compact, noiseless, and does not incur frictional forces which could induce material damage and cause energy consumption and thus parasitic heating.

Figure 1C:
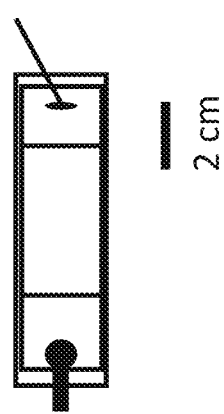

FIG. 1C is a photograph of a freestanding two-layer P(VDF-TrFE-CFE) stack with an active area of 2×5 cm² defined by 14 nm thick CNT electrodes on both sides. FIG. 1D shows infrared (IR) thermal images of the free-standing EC polymer stack film under ambient conditions, taken immediately after an electric field of 58.3 MV/m was applied (upper image) and after removal of the electric field (lower image). The instantons (adiabatic) temperature increase of the EC film when an electric field is applied results from the dipole orientation in the relaxor ferroelectric polymer and consequent entropy decrease in the system. A temperature rise (ΔT) of roughly 6 K was measured using an IR camera. The temperature change measured by the IR camera underestimates the adiabatic temperature change because the IR imaging system only operates at a frame rate of 12 Hz. Heat loss from the EC stack's active area to the non-active area, together with the heat exchange with air, could cause a significant temperature change, and the transient rise and fall is averaged during the imaging frame, leading to a smaller measured ΔT. (31)

Figure 2B:
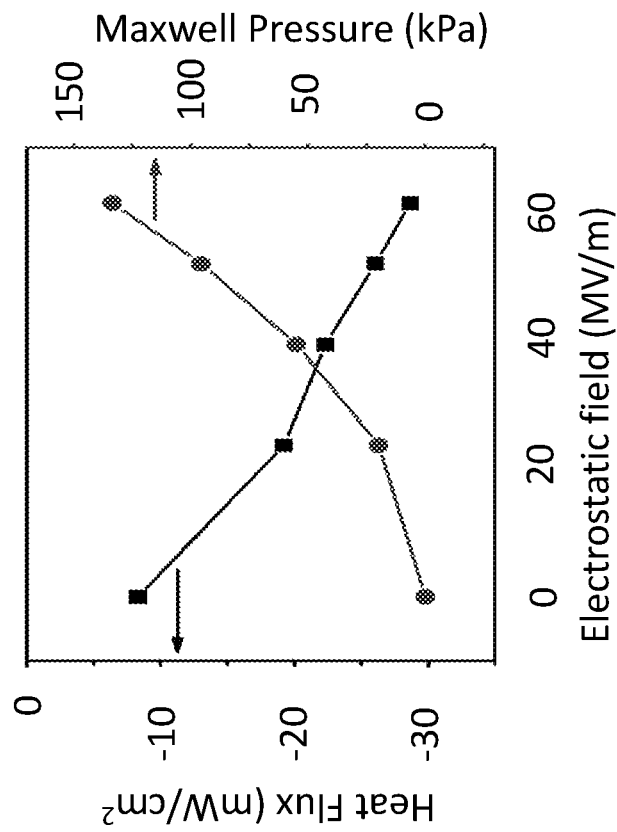
FIG. 2B plots the maximum achieved average heat flux and Maxwell pressure as a function of electrostatic field (negative heat flux indicates cooling). As the electrostatic field is increased, the pressure between the EC polymer stack and the heat source grows, and the heat flux between the heat source and EC polymer stack increases in magnitude.
Figure 2A:
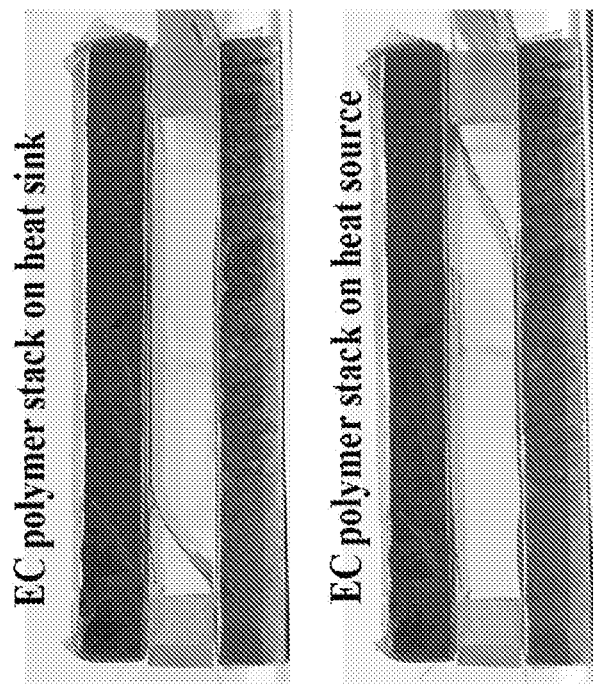
FIG. 2A is a side view photograph of the EC polymer stack in contact with the heat sink (top) and the heat source (bottom) after application of an electrostatic force.

FIG. 2A shows a side view of the EC polymer device when the EC polymer stack is electrostatically actuated to form thermal contact with the bottom and top aluminum plate surfaces, respectively. The actuation is achieved by applying an electrostatic field across the polyimide film of either the bottom or top plate to drive the movement of the EC polymer stack. The electrostatic force that acts to move the EC polymer stack is determined by the electric field across the air gap. As can be seen in FIG. 1B, the air gap is much smaller near the attachment point. At this point, assuming that the thickness of the polyimide layer is much larger than its surface roughness, the pressure acting to move the film is (31)

$$P_{contact} = \varepsilon_o \varepsilon_r E_{contact}^2 = \varepsilon_o \varepsilon_r V^2/d^2_{polyimide} \quad (1a)$$

where E is the applied electrostatic field, $\varepsilon_o$ is vacuum permittivity, $\varepsilon_r$ is the dielectric constant of polyimide, and $d_{polyamide}$ is the thickness of the polyimide. The $\varepsilon_r$ of the polyimide used in this study is 4. $P_{contact}$ under an applied electrostatic field of 61 MV/m is approximately 133 kPa (equivalent to 1.32 atmospheres (atm)). Away from the attachment point, the pressure is dominated by the air gap. The air gap $d_{gap}$ is largest at the point where the film attaches to the opposite electrode. The pressure at this point is $$P_{gap} = \varepsilon_o \varepsilon_r E_{gap}^2 = \varepsilon_o \varepsilon_r V^2/d^2_{gap} \quad (1b)$$

Since $d_{gap} \gg d_{polyimide}$, $P_{gap}$ pressure is much less than $P_{contact}$. While $P_{gap}$ may not be great enough to move the EC stack, the bending of the film allows for the film to progressively attach a greater length to the active electrode (the electrode at which the voltage is applied). In other words, the attachment point moves across the length of the film until all of the film, except for the small section needed to span the attachment point to the opposite electrode, is moved to the active electrode. This approach to electrostatic actuation has been used to move films for valves and may be used when the bending stiffness of the film can be overcome by the electrostatic forces. This type of "S-shaped film actuator" (e.g. (30)) is named after the S shape of the edge of the film.

Thus, the EC polymer stack shuttles between the two aluminum plates when an electric field is alternately applied across the top silver nanowire electrode and the top CNT layer of the EC stack, and the bottom silver nanowire electrode and the bottom CNT layer of the EC stack. The electrostatic pressure $P_{contact}$ on the film that is in contact with the polyimide, roughly given by equation 1a, increases the thermal contact between the EC stack film and polyimide and thus facilitates the heat flux between the EC material and the aluminum plates. The increase in heat flux was confirmed by measurement during the cooling cycle of an EC polymer stack when an electric field of 66.7 MV/m (square wave, 0.8 Hz, 50% duty cycle) was applied across the P(VDF-TrFE-CFE) films. As shown in FIG. 2B, as the electrostatic field is increased from 0 to 61 MV/m, the heat flux is increased from −8.3 mW/cm² to −29.7 mW/cm², corresponding to a 258% increase in heat flux. To avoid issues with electrical breakdown, the electrostatic field was set to a maximum of 61 MV/m.

c. Electrode Configuration and Timing of the Electric Field(s)

Figure 3A:
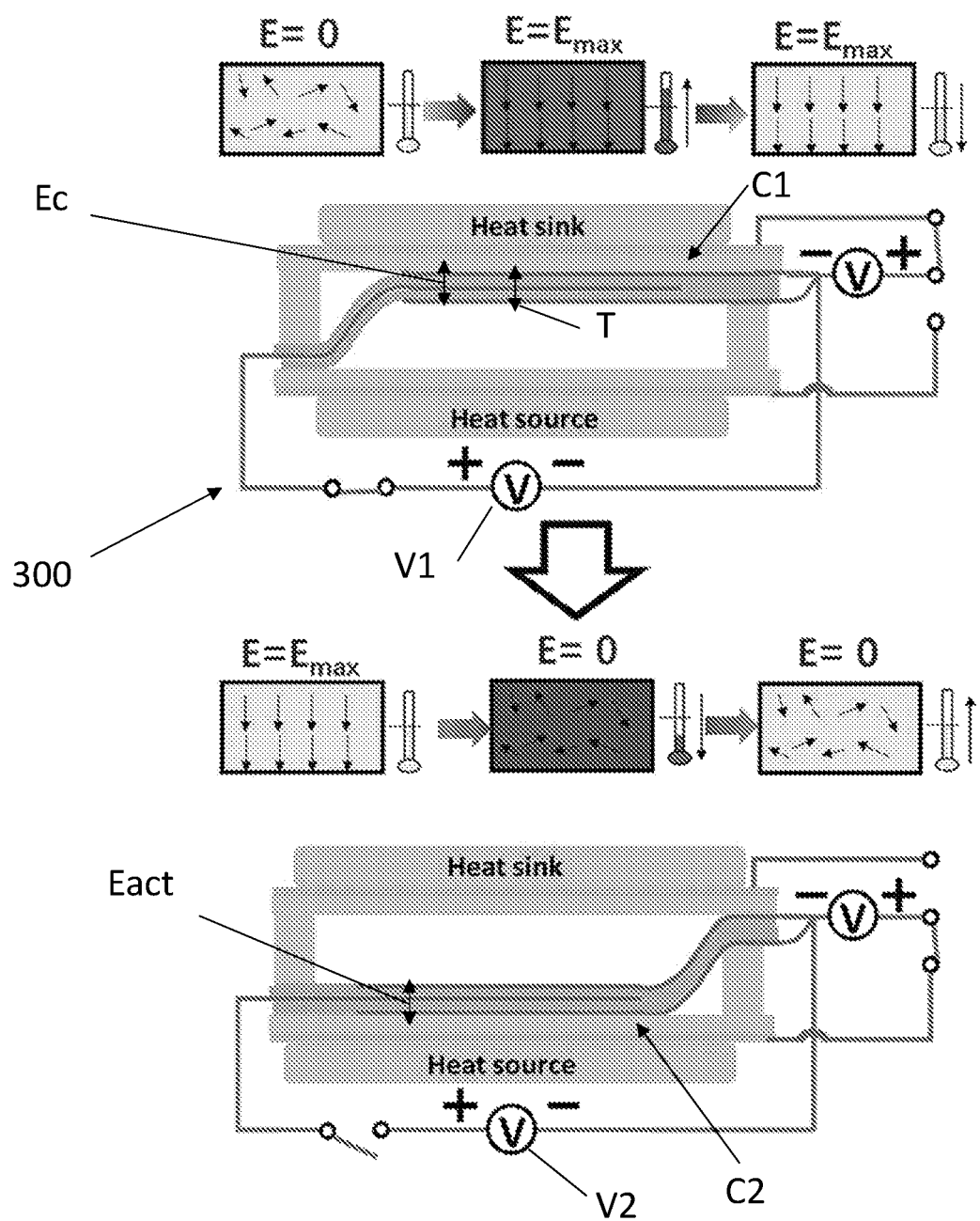
FIGS. 3A-3B. Operation procedure of the P(VDF-TrFE-CFE) cooling device so that heat moves from the heat source to the heat sink when the device is electrostatically actuated.
Figure 3B:
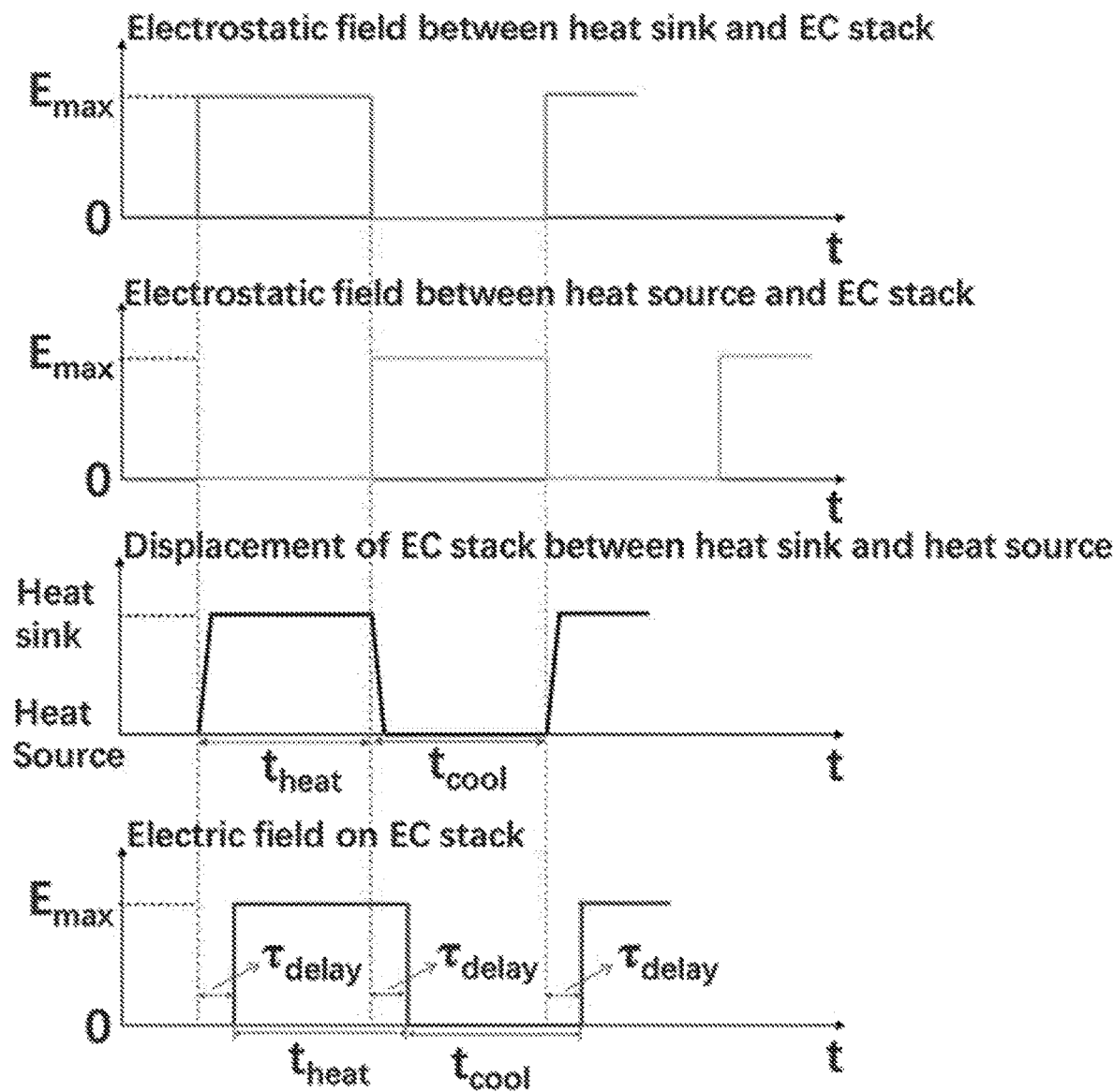

FIG. 3 illustrates the working mechanism of the present EC cooling device includes an operating cycle consisting of four main steps: 1) electrostatic actuation of the EC polymer stack towards the bottom aluminum plate (heat sink), 2) electrocaloric heating of the EC polymer stack, 3) electrostatic actuation of the EC polymer stack towards the top aluminum plate (heat source), and 4) electrocaloric cooling of the EC polymer stack. For simplicity of circuitry design, the EC cooling device is fabricated with a common cathode by connecting the two outer CNT electrodes of the EC polymer stack with a thin copper wire. The inner (middle) CNT electrode of the EC polymer stack serves as the anode applying an electric field across the P(VDF-TrFE-CFE) film, so as to achieve electrocaloric heating. The silver nanowire films in the heat sink and heat source function as the anode applying an electrostatic field across the polyimide so as to achieve electrostatic actuation. Voltage switching for the electrostatic actuation is controlled by an electric relay that switches between the silver nanowire anodes of the heat source and heat sink. During one cycle of heat transfer, the electrostatic field is first applied between the silver nanowire on the heat sink and the outer CNT electrodes to generate the electrostatic pressure transporting the EC polymer stack towards the heat sink. The time required to move the EC polymer stack from the heat source to the heat sink is roughly 0.03 seconds (s), but a short delay ($\tau_{delay}$=0.15 s) before applying an electric field across the P(VDF-TrFE-CFE) film is preprogrammed in the EC waveform, to allow for the EC polymer stack to form sufficient thermal contact with the polyimide. For electrocaloric heating, an electric field is applied across the P(VDF-TrFE-CFE) film such that the molecular dipoles in the film have an orderly alignment. The alignment of the molecular dipoles results in a decrease in entropy that increases the temperature of the EC polymer film. A temperature gradient is thus created, causing heat transfer from the EC polymer stack to the heat sink. After a predefined heating time, $t_{heat}$, the electrostatic actuation is switched using the electric relay so that the EC polymer film is transported towards the heat source. After another a short delay ($\tau_{delay}$) to allow sufficient thermal contact between the polyimide in the heat source and the EC stack, electrocaloric cooling is initiated by switching off the electric field across the P(VDF-TrFE-CFE) film, allowing randomization of the dipoles' orientation within the polymer. As a result, during a predefined cooling time, $t_{cool}$ the entropy of the film increases while heat is transferred from the heat source to the EC polymer stack, thus completing one cycle of heat transfer.

d. Characterization of Device Performance

Figure 4B:
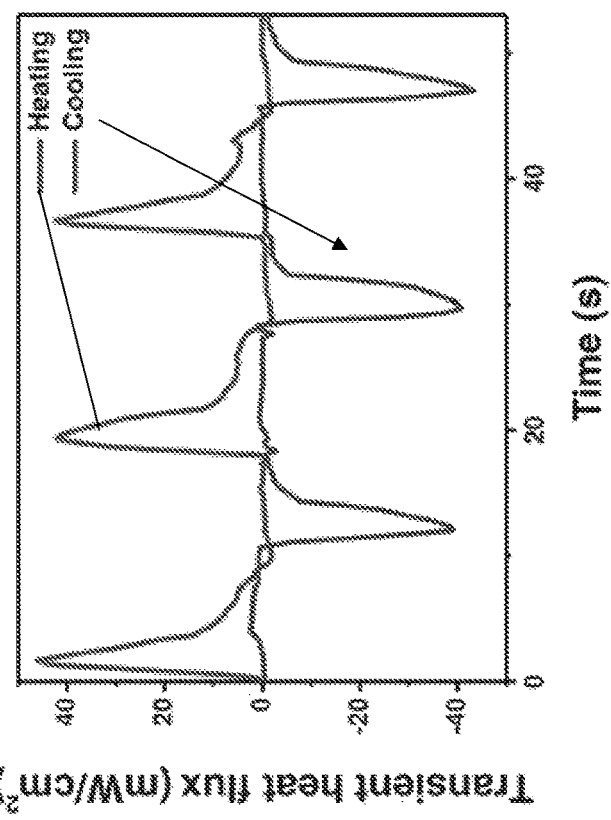
FIGS. 4A-4F. Performance of the EC polymer cooling device.
Figure 4A:
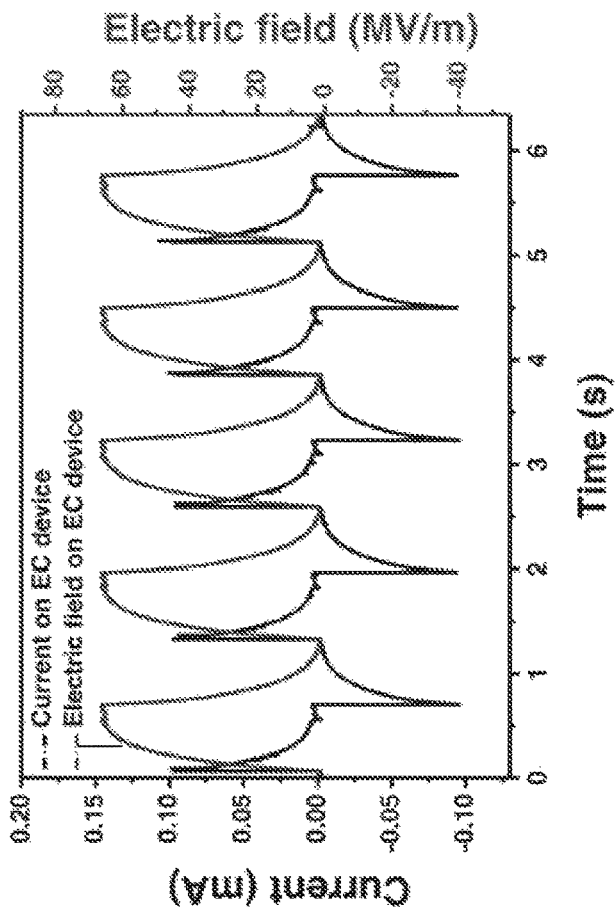
Figure 4C:
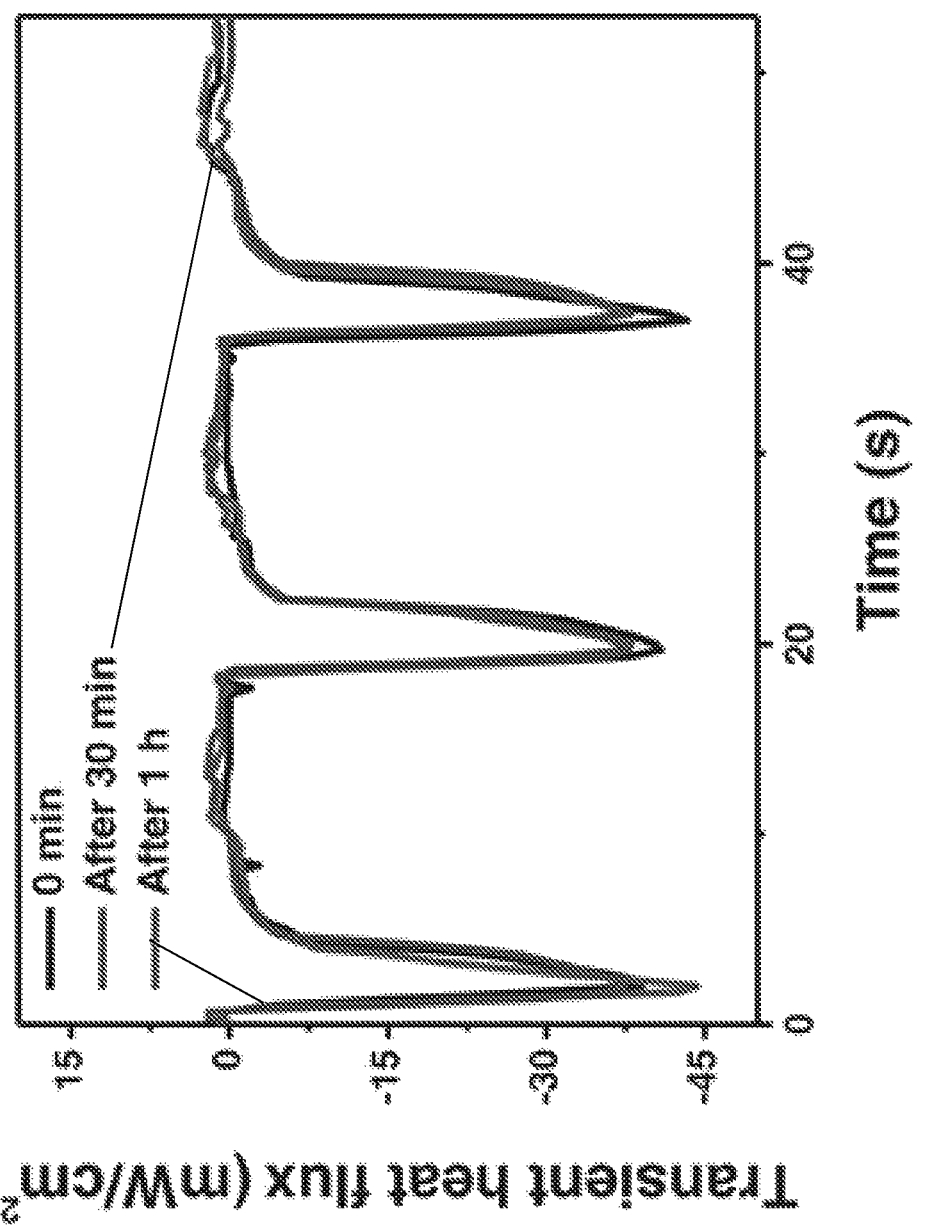
Figure 9:
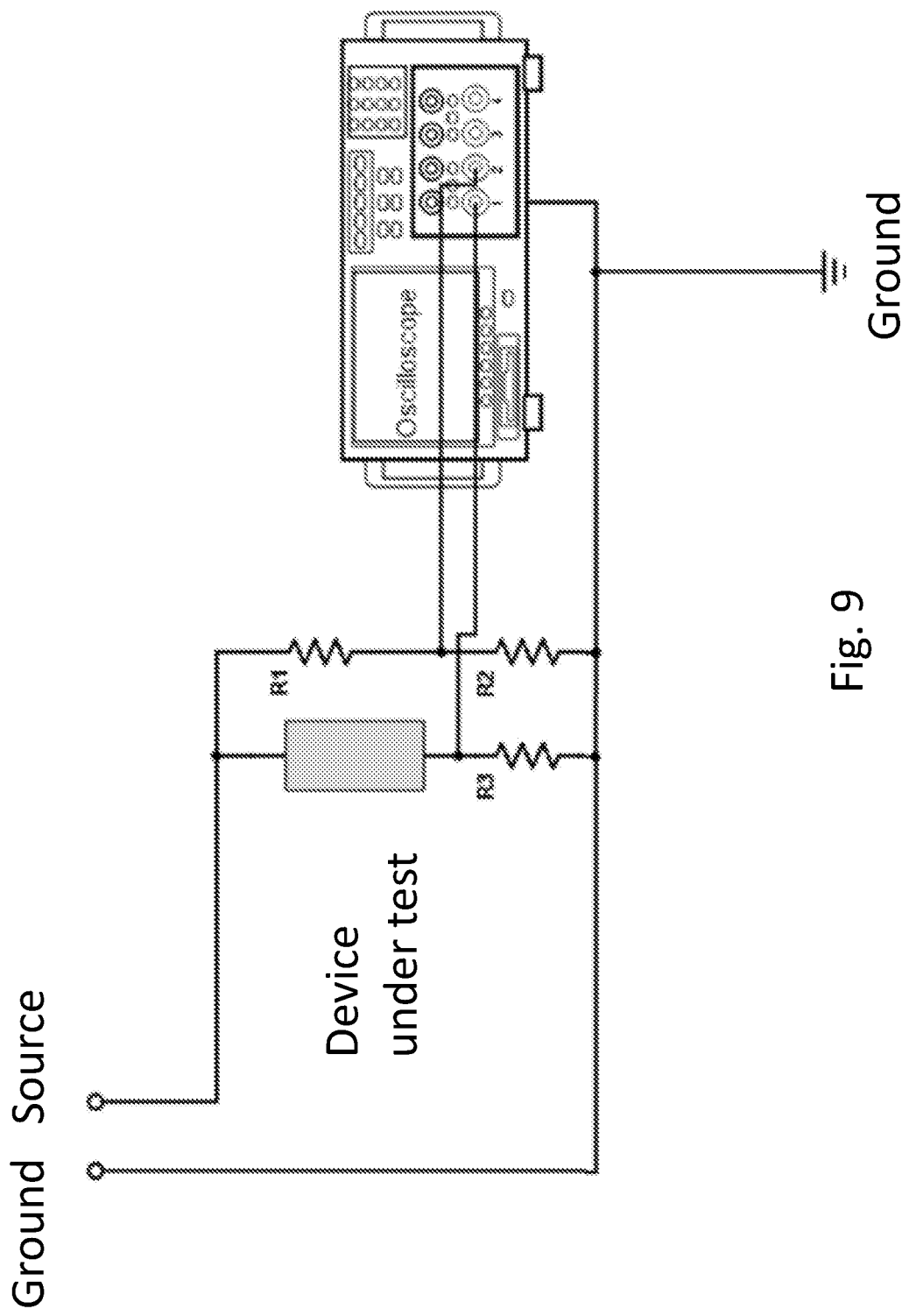
FIG. 9. The voltage divider circuitry used to measure electric current and voltage for calculation of electrostatic power consumption.

Power consumption of the P(VDF-TrFE-CFE) cooling device was further investigated. FIG. 9 shows details of the circuitry and a calculation for measuring the power consumption. The electric energy consumption of the EC device in an EC cycle can be calculated using Eq. (2)

$$W_{EC} = \int_{t1}^{t2} V_{EC} \times I_{EC} dt \qquad (2)$$

where $W_{EC}$ is the electrical work done in one EC cycle, and $V_{EC}$ and $I_{EC}$ are the measured operating voltage and current, respectively. FIG. 4A shows the voltage and current of the EC device at 0.8 Hz, and the calculated power consumption averaged over one cycle is determined to be 2 mW/cm² under an applied electric field of 66.7 MV/m and an electrostatic field of 61 MV/m. Leakage was found to be insignificant when compared to the charging and discharging currents of the EC film. Additionally, when the P(VDF-TrFE-CFE) cooling device operated without an electric field, there was no observed heat flux. This lack of heat flux indicates that Joule heating from the electrostatic actuation is negligible. Joule heating from the electrocaloric effect was also found to be insignificant by comparing the heat flux in both heating and cooling modes with an applied electric field of 50 MV/m and a frequency of 0.06 Hz, as shown in FIG. 4B. The comparison was performed as follows. During the cooling mode, an electric field was applied across the P(VDF-TrFE-CFE) film when the EC polymer stack was electrostatically attached to the heat sink, and the heat flux sensor on the heat source was used to measure the heat flux due to cooling for zero applied electric field is (see also the mechanism described above in reference to FIG. 3). During the heating mode, an electric field was applied when the EC polymer stack was electrostatically attached to the heat flux sensor. The same heat flux sensor was used to measure electrocaloric heating. If Joule heating due to the electrocaloric effect were to generate an excessive amount of heat across the film, the measured heat flux in the cooling mode would be smaller than measured the heat flux in the heating mode. However, the similar heat flux measured in both modes (FIG. 4B) suggests that Joule heating in the EC polymer stack is insignificant. FIG. 4C verifies that the measured effects are not transient, illustrating no deviation in the heat flux of the P(VDF-TrFE-CFE) cooling device after continuous operation for >1 hr as compared to the initial heat flux. This measurement also supports that Joule heating within the device is not significant.

The average heat flux is less than optimal even when the electrostatic actuation field has a frequency sufficiently low to allow for (1) the time required for the electrocaloric effect to adequately change the temperature of the EC polymer stack) as well as (2) the time required for the EC polymer stack to move between the heat sink and the heat source and form good thermal contact during $\tau_{delay}$. However, the average heat flux of the cooling device can be increased by applying the electrostatic actuation field at a higher frequency. Heat transport can also be improved by increasing the voltage on the EC film (and therefore increasing the magnitude of the electrostatic actuation field, see FIG. 10). Under the applied EC electric field of 91.7 MV/m at the frequency of 0.05 Hz, 111.3 mJ/cm² of heat was moved in each cycle with a transient peak heat flux of 130 mW/cm². The average heat flux under this operation is 5.57 mW/cm². However, FIG. 4D shows a higher average heat flux can be achieved when the applied electrostatic actuation field has a higher frequency and also illustrates a direct relationship between average heat flux and frequency of a 66.7 MV/m electrostatic actuation field applied to the P(VDF-TrFE-CFE) cooling device.

Figure 4E:
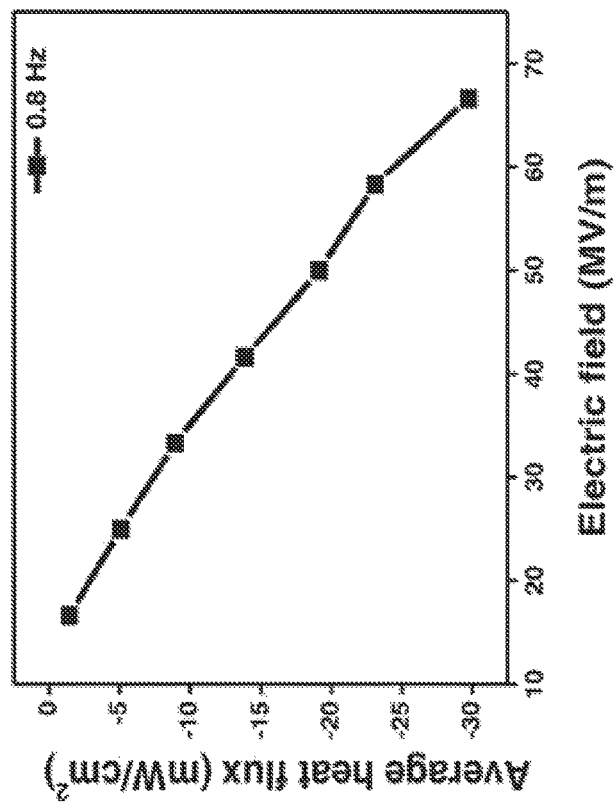
Figure 4D:
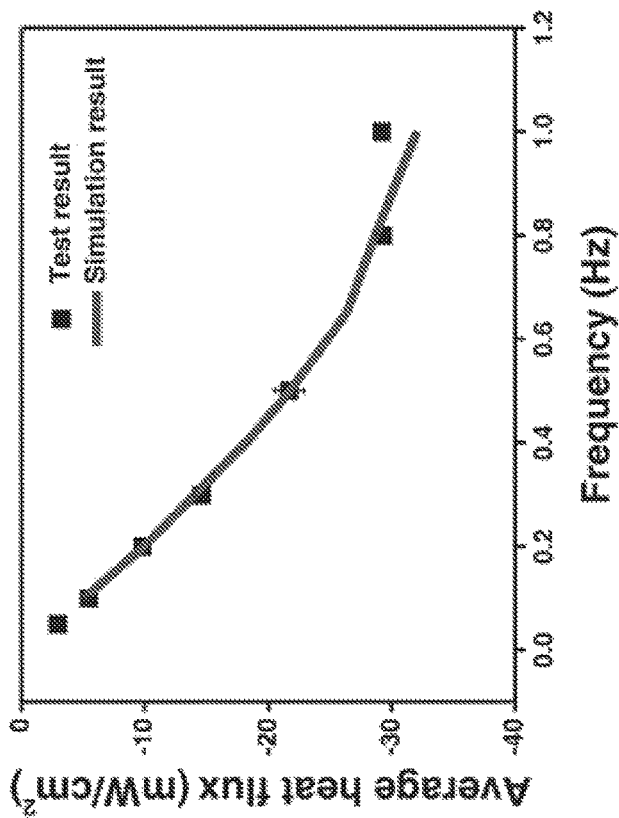

Nonetheless, although the electrostatic actuation field of the EC polymer stack can be applied at much higher frequencies, FIG. 4D shows the optimal frequency for the example P(VDF-TrFE-CFE) cooling device measured herein was limited to 0.8 Hz. This limitation correlates closely with the expected value when the rate of heat dissipation from the heat sink to air is taken into account. In other words, at an operating frequency of 0.8 Hz, the P(VDF-TrFE-CFE) cooling device transfers heat from the heat source to the heat sink faster than heat could be transferred from the heat sink to air.

As mentioned above, another way to maximize heat flux is by optimizing the magnitude of the actuation electric field applied across the EC polymer stack. FIG. 4E shows the heat flux of a P(VDF-TrFE-CFE) cooling device operated at a frequency of 0.8 Hz as a function of the applied electric field. At a frequency of 0.8 Hz, the maximum electric field was set at 66.7 MV/m to avoid electrical breakdown of the P(VDF-TrFE-CFE) cooling device. Further refinement of the material processing or lamination techniques could allow for an increase in the maximum electric field and thus allow for significantly greater heat flow per cycle.

Even without further improvements, a heat flux of 29.7 mW/cm² under an applied electric field of 66.7 MV/m was achieved, corresponding to a specific cooling power of 2.8

W/g (155 times higher than the highest reported cooling power of 0.018 W/g, calculated using experimentally obtained heat flux data for other EC devices. (24,33,34)

Other than specific cooling power, COP is widely used to characterize the performance of active cooling devices. (11,12).

The P(VDF-TrFE-CFE) cooling device achieved a COP of 13 under an applied electric field of 66.7 MV/m at a frequency of 0.8 Hz, wherein $$COP = \frac{Q_{transferred}}{W_{in}} = \frac{\text{Heat transferred}}{\text{Electrical work in}}$$

To date, there have been no other experimentally obtained COP data for EC cooling devices.

Figure 4F:
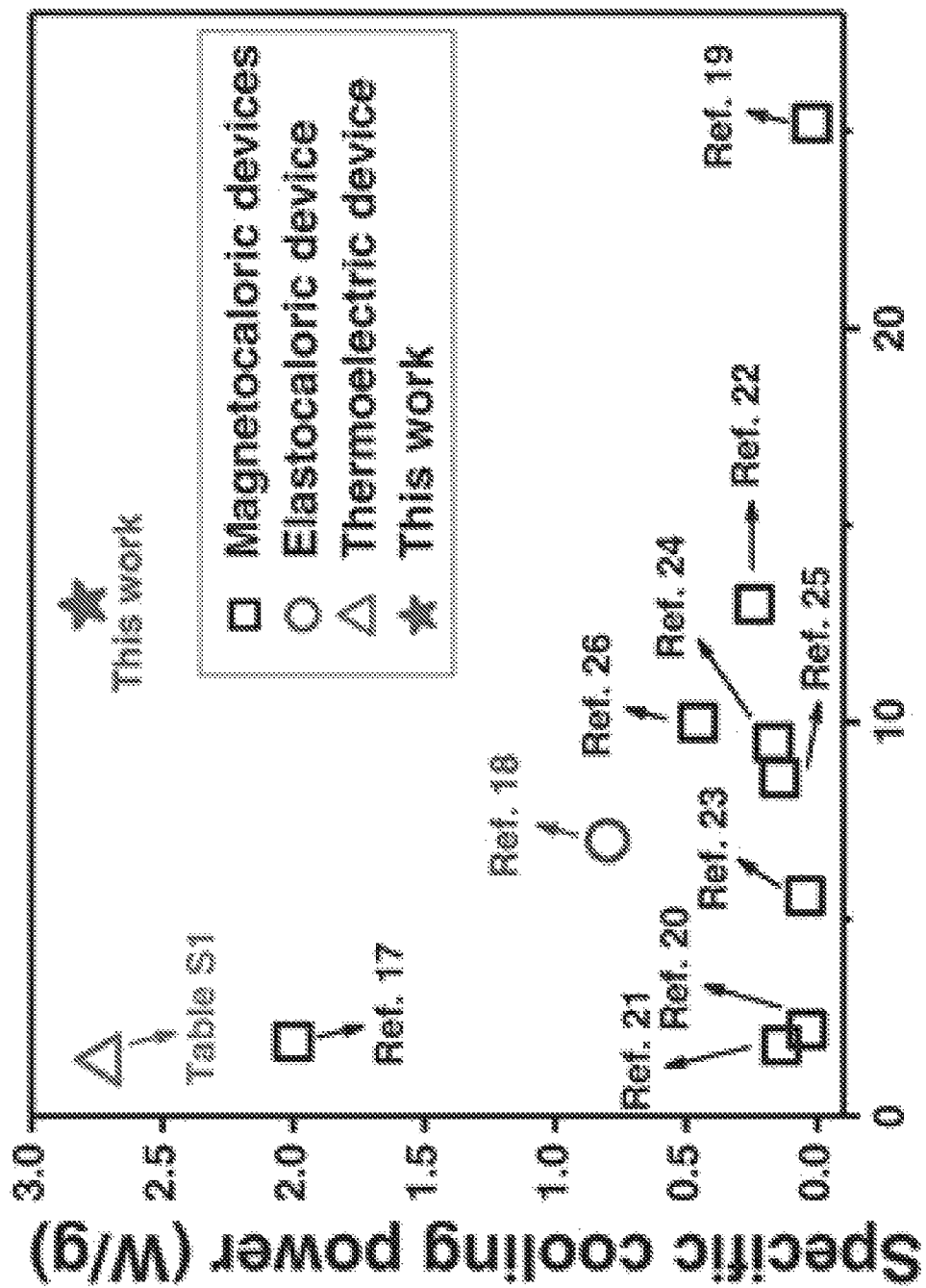

FIG. 4F compares COP and specific cooling power of the P(VDF-TrFE-CFE) cooling device (filled symbols) with experimentally obtained COP and specific cooling power of magnetocaloric (17, 19-26) and elastocaloric (18) devices in the reported literature (open symbols). FIG. 4F illustrates the P(VDF-TrFE-CFE) cooling device described herein has a specific cooling power of 2.8 W/g with a COP of 13, setting a new standard for solid state refrigeration.

e. Applications

The highly efficient and compact EC cooling device described herein not only leapfrogs the performance of existing solid-state cooling technologies, but also brings solid state cooling closer to reality for a variety of practical applications that require compact and/or mechanically flexible refrigeration. For example, the inherent flexibility of the S-shaped EC polymer stack enables fabrication of a flexible P(VDF-TrFE-CFE) cooling/heating device conforming to a curvilinear surface of an object so as to heat or cool the object.

Figure 5A:
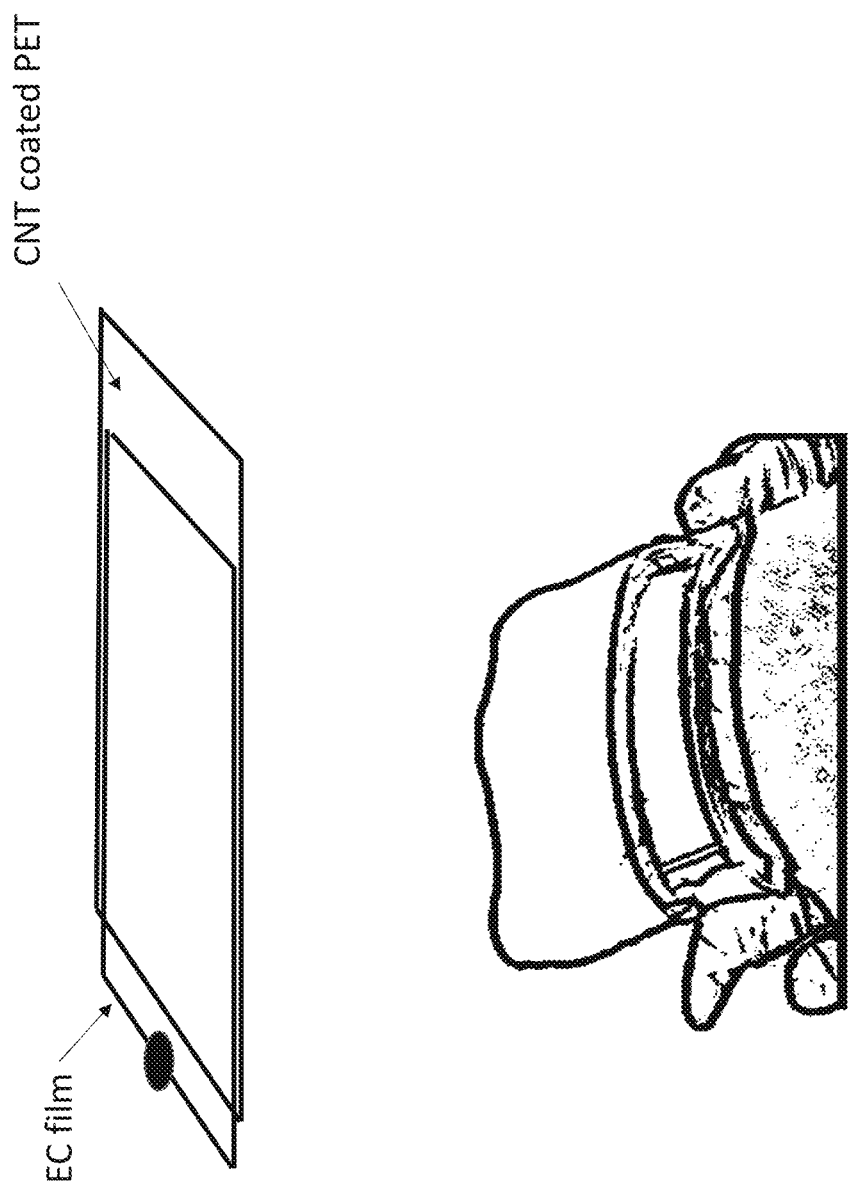
FIGS. 5A-5B. Performance of the flexible EC cooling device.
Figure 5B:
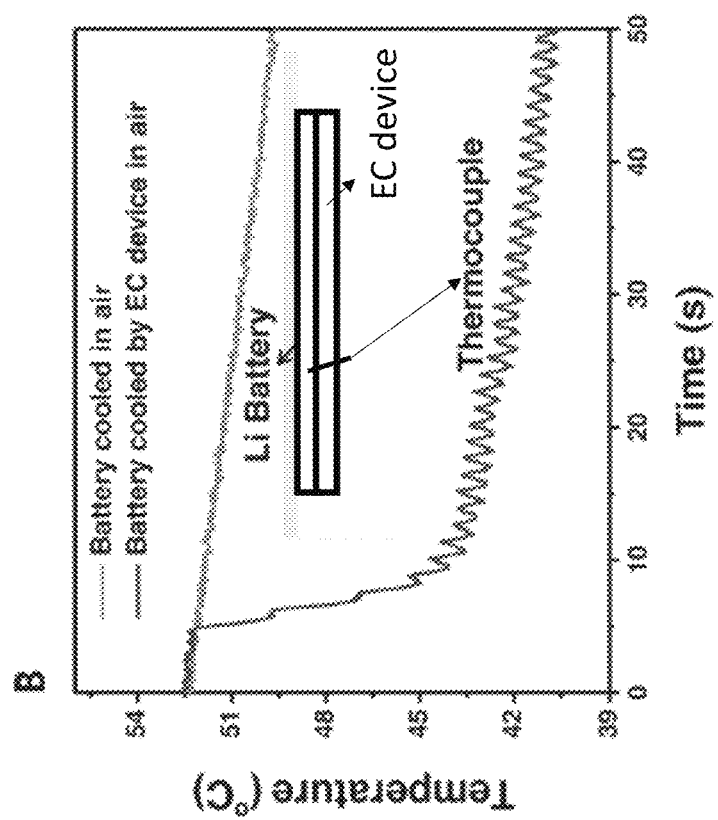

FIG. 5A displays a flexible EC cooling device consisting of a transparent flexible frame made of conductive CNTs coated on a 100 μm thick PET that serves as the components for electrostatic actuation. The S-shaped EC polymer stack was fixed to a Polydimethylsiloxane (PDMS) frame spacer with a thickness of 4 mm. The device geometry is 7 cm×3 cm×0.5 cm. The device cooling power was demonstrated by attaching it onto a typical smartphone battery (Samsung Galaxy S4). Under high smartphone workloads, the battery heated to 52.5° C. When allowed to cool in air, the surface temperature of the battery measured with a surface mount thermocouple decreased by 3° C. in 50 s (FIG. 5B). After the flexible EC cooling device was attached to the battery, the surface temperature of the battery was observed to decrease

TABLE S1

Performance comparison of elastocaloric, magnetocaloric, thermoelectric and EC cooling devices.

| Devices | Specific cooling power (W/g) | Max Temp. Span (K) | COP (Temp. span) | $COP_{Carnot}$ | $COP/COP_{Carnot}$ | Ref. |
|---|---|---|---|---|---|---|
| Magnetocaloric* | 2.001 | 18 | 1.9 (11 K) | 24.8 | 0.0766 | 17 |
| | 0.0201 | N/A | 25.22 (3 K) | 91 | 0.277 | 19 |
| | 0.03946 | 7 | 2.2 (4 K) | 68.25 | 0.032 | 20 |
| | 0.135 | 7.5 | 1.8 (0.5 K) | 546 | 0.003 | 21 |
| | 0.24 | 11.5 | 13 (0 K) | N/A | N/A | 22 |
| | 0.04545 | N/A | 5.6 (N/A) | N/A | N/A | 23 |
| | 0.166 | 23 | 9.5 (10 K) | 27.3 | 0.348 | 24 |
| | 0.1429 | N/A | 8.6 (0 K) | N/A | N/A | 25 |
| | 0.455 | 29 | 10 (2.5 K) | 109.2 | 0.092 | 26 |
| | | | 3.5 (15.3 K) | 17.84 | 0.196 | |
| Elastocaloric** | 0.8 | 15.3 | 5.5 (6.5 K) | 42 | 0.131 | 18 |
| | | | 7 (5 K) | 54.6 | 0.128 | |
| Thermoelectric | N/A | N/A | 3.5 (10 K) | 27.3 | 0.13 | 34 |
| | 2.7 | | 1.4 (1.4 K) | 211.9 | 0.007 | † |
| This work | 2.8 | 3.6 | 13 (1.4 K) | 211.9 | 0.661 | — |

*External magnetic source needed
**External actuator needed
† Commercially available module (TECI-04908, Heberi I. T. (Shanghai, China) Co., Ltd) at maximum rated specific heat flux and same temperature span as our EC device.

The specific cooling power, maximum temperature span, COP with an associated temperature span, COPCarnot, and COP/COPCarnot of elastocaloric, magnetocaloric, thermoelectric EC cooling devices are compared in Table S1. The specific cooling power is higher than those of the earlier devices. The thermodynamic efficiency (COP/COPCarnot) is higher than devices with high specific heat flux suggesting that this technology is well-suited to applications where high heat flux at low temperature spans is important. We note that some of the reported COP values for other technologies may not have accounted for all device power inputs and therefore should be considered optimistic estimates. With the relatively small temperature span of our EC cooling device and the correspondingly large COPCarnot, the projected COP/COPCarnot of our device is smaller than the values reported for some of the earlier devices operating over larger temperature spans.

by 8° C. in the first 5 s with EC cooling activated under an applied field of 66.7 MV/m at 0.8 Hz.

Overheating of smartphone batteries under high workloads creates a fire hazard, and prolonged use under thermal overload causes reduced battery lifetime and fatigue of other materials and components in the smartphone. Embodiments of the flexible cooling approach described herein can solve this problem. Vapor-compression refrigeration systems, on the other hand, are difficult to scale down to meet the cooling demands of these modern technologies such as handheld devices and wearable electronics.

f. Materials and Methods

This section provides further information on the materials and methods used to fabricate the devices of the first example used to obtain the results in FIG. 1A-5.

(i) Preparation of Carbon Nanotubes Solution

P3-SWNTs (6 mg), purchased from Carbon Solution, Inc., were dispersed in a mixture of isopropyl alcohol (18 ml, IPA) and deionized water (2 ml, DI water) using a bath sonicator (VWR B9500A-DTH) for 2 h. The solution was then centrifuged at 8500 rpm for 15 min, and the supernatant was used as the carbon nanotube solution.

(ii) Fabrication of the EC Polymer Stack

The terpolymer of P(VDF-TrFE-CFE) (63.2/29.7/7.1 mol %, Piezotech Arkema group) was dissolved at 8 wt % in 2-Butanone (Spectrum Chemical) by sonication for 2 h. Then the solution was filtered using a PTFE filter with pore size of 0.2 µm and degassed using a bath sonicator. P(VDF-TrFE-CFE) films were prepared by casting the solution on glass substrates, drying at room temperature overnight, and curing at 90° C. for 2 h. The thickness of the films is 30 µm. CNT solution was spray-coated onto the EC polymer films using a mask (2×7.5 cm2) to form uniform CNT electrodes with sheet resistance of 6.5 kΩ/□. Two EC polymer films were peeled off their glass substrates and then attached together with an overlapping region of 2×5 cm2 using a laminator (SircleLam 336-6R).

The EC polymer films were laminated with one CNT electrode sandwiched between the EC polymer films and the other CNT electrode residing on top of the EC polymer stack. A third CNT electrode was spray-coated on the bottom side of the EC polymer stack using the mask. Finally, the laminated EC polymer stack with three CNTs electrodes was annealed at 120° C. for 16 h in a vacuum oven to further remove the residual solvent and increase the crystallinity of the P(VDF-TrFE-CFE) polymer films.

(iii) Fabrication of High Performance of P(VDF-TrFE-CFE) Cooling Testing Apparatus First, thin copper wires were attached onto each CNTs electrode with carbon grease covered by scotch tape to form low resistance junctions between CNTs electrodes and copper wires. Second, the EC polymer stack was elastically bent into an S-shape and fixed onto a PMMA frame that functions as a 6 mm spacer. Third, a heat flux sensor (OMEGA HFS-4) was bonded to an aluminum plate (6.3×6.3 mm) using double-sided Kapton tape that was spray-coated with a thin silver nanowire layer (Zhejiang Kechuang Advanced Materials Co., Ltd). Fourth, a polyimide film with thickness of 15 µm was coated on the surface of the silver nanowire layer, forming a heat source structure of aluminum plate/heat flux sensor/Kapton tape/silver nanowire layer/polyimide. Fifth, a heat sink was fabricated similarly to the heat source but without the attachment of a heat flux sensor. Finally, the heat source and heat sink were attached onto the top and bottom sides of the PMMA frame to complete the fabrication of the P(VDF-TrFE-CFE) cooling device.

(iv) Description of Thermodynamic Cycle

Figure 6:
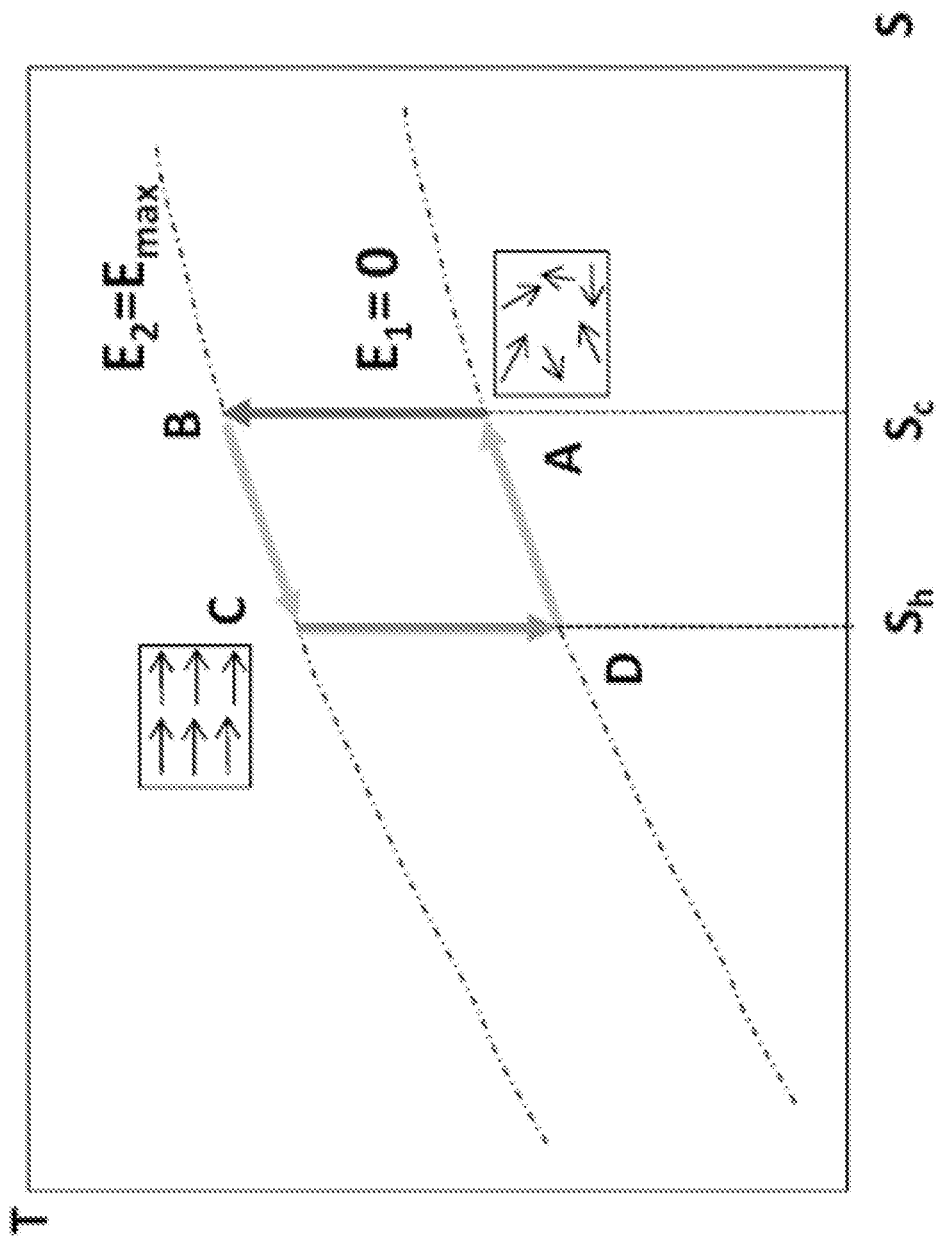
FIG. 6. Thermodynamic refrigeration cycle driven by the electrocaloric effect.

FIG. 6 shows one possible thermodynamic refrigeration cycle based on the electrocaloric effect (adapted from [43]). At point A, no electrical field is applied (E=0), and the dipoles within the electrocaloric material (ECM) are oriented randomly. When an external electric field is applied (A→B), the dipoles in the ECM start to align along the electric field. The temperature of the ECM increases rapidly, while the entropy is approximately constant due to the short time for heat exchange (ΔQ=0). This step is similar to the compression step in a conventional vapor compression refrigeration cycle. In the next step (B→C), the electric field is kept constant, and there is finite heat transfer from the ECM to the environment, causing the temperature and entropy of the ECM to decrease.

During step C→D, the external electric field is removed, and the dipoles return to a state of disorder. Like A→B, C→D is also approximated as adiabatic due to short time available for heat transfer. The entropy is unchanged whereas the temperature rapidly decreases. At point D, the ECM reaches its lowest temperature. In step D→A, the ECM absorbs heat.

(v) Measurement of ECP Crystallinity

Figure 7:
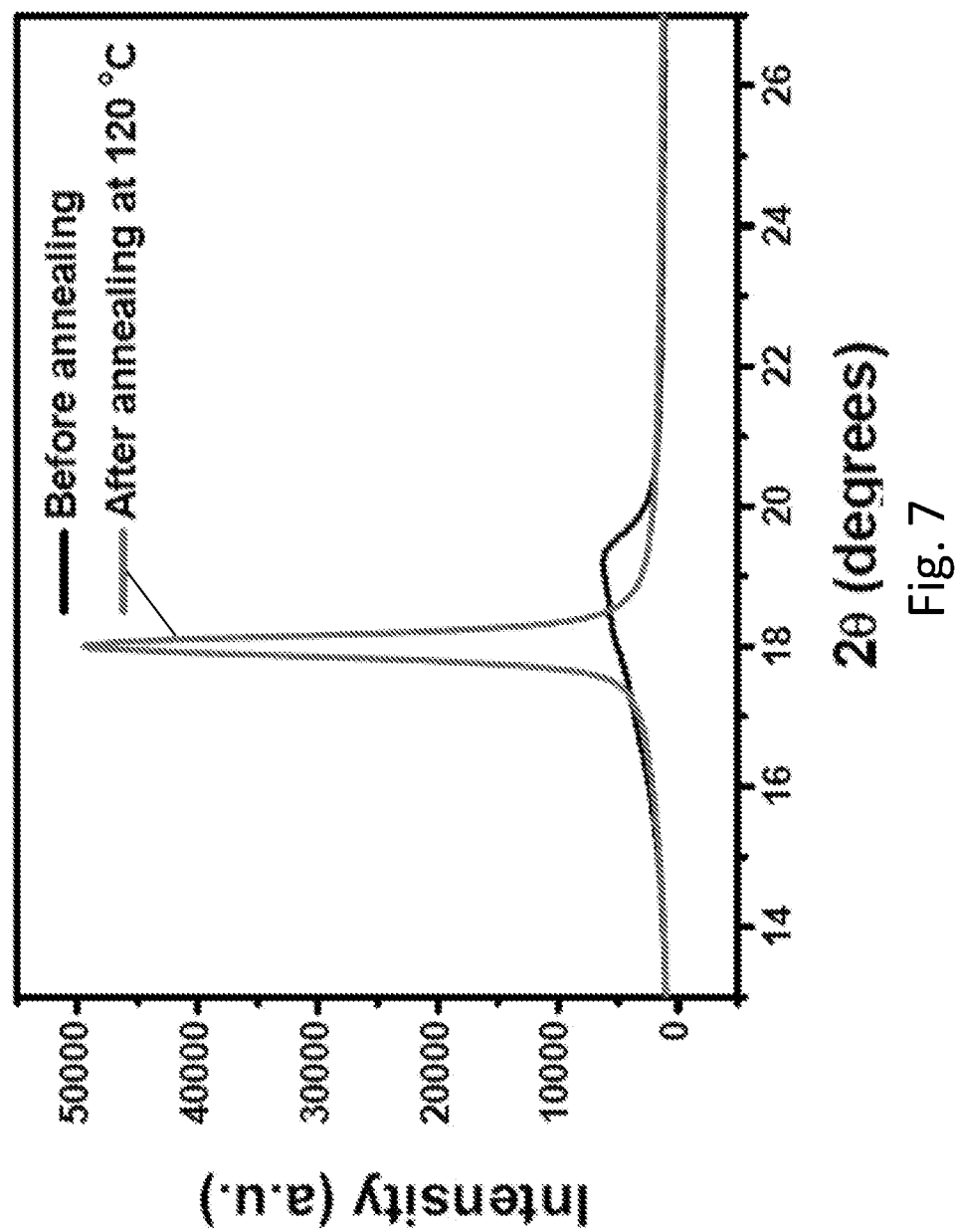
FIG. 7. X-ray diffraction of P(VDF-TrFE-CFE) films before and after annealing at 120° C. for 16 h.

As can be seen form FIG. 7, the crystallinity and crystal size increased after annealing at 120° C. for 16 h which further increased ΔT.

(vi) Adiabatic Temperature Response of the EC Polymer

Figure 8B:
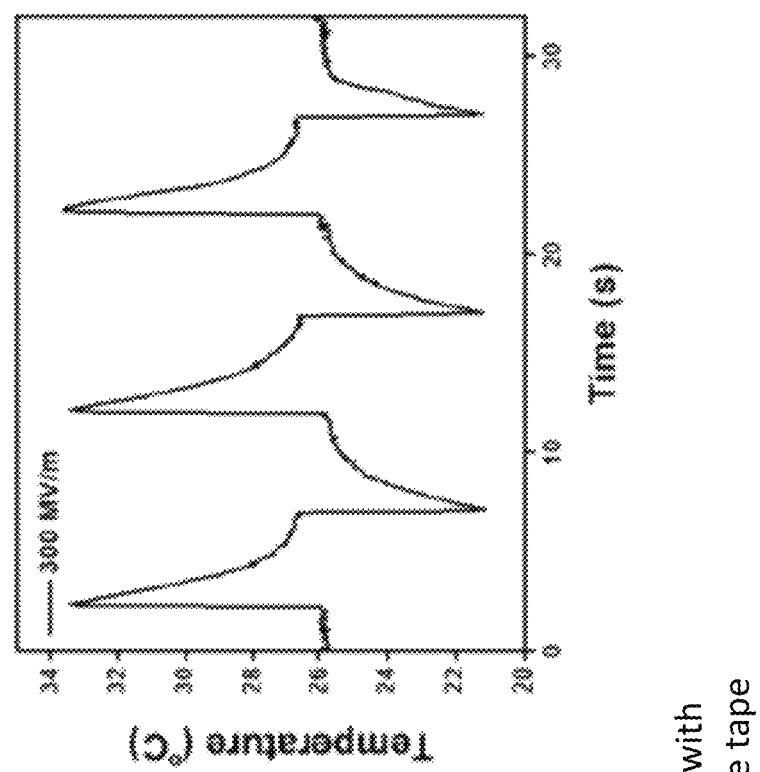
FIG. 8A shows a single P(VDF-TrFE-CFE) film assembly and FIG. 8B shows the measured temperature profile in response to voltage cycling (300 MV/m).
Figure 8A:
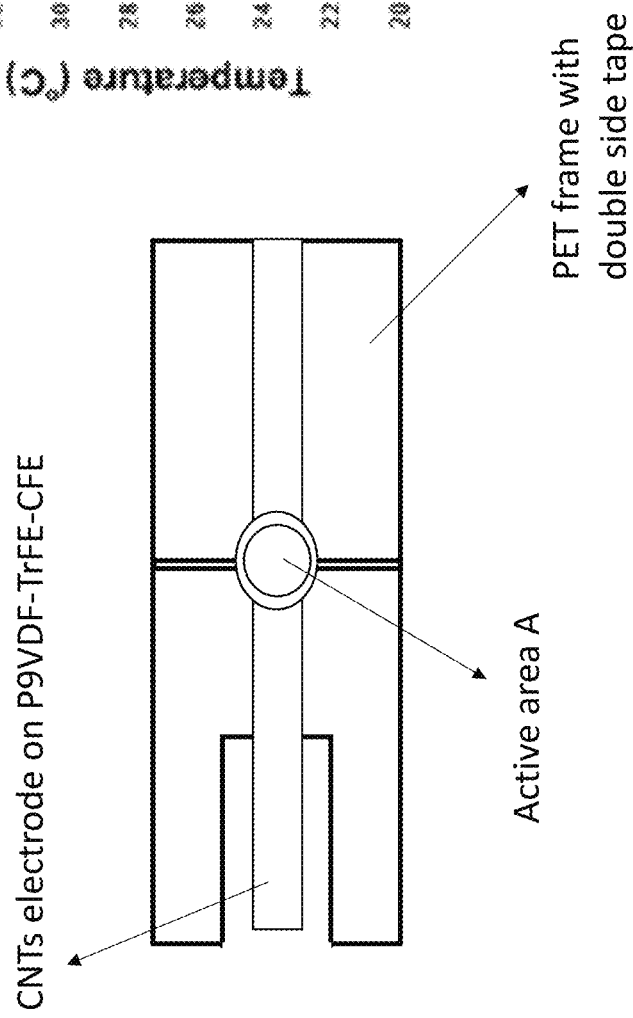

A freestanding single P(VDF-TrFE-CFE) film (15 µm) was attached to a PET frame using double-sided Kapton tape as shown in FIG. 8A. A solution of single-walled carbon nanotubes was spray-coated to form electrodes on both sides of the P(VDF-TrFE-CFE) film and a circular active area 6 mm in diameter was defined. FIG. 8B shows the temperature of the film measured by an infrared camera as a function of applied electric field. The adiabatic temperature change (ΔT) was estimated at 6 K under the applied electric field of 300 MV/m.

(vii) Measurement of electric power

In order to calculate the power consumption from the electrostatic actuation, it was necessary to measure both the applied voltage and the electric current through the EC polymer stack. The voltage divider circuitry used to measure the current and voltage is shown in FIG. 9. A computer-connected oscilloscope is used to record the current and voltage of the Device Under Test. Channel 1 and Channel 2 was used for the current and voltage measurements, respectively. To measure the EC current and voltage by an oscilloscope, resistors R1 (=2000 NM), R2 (=220 KSf), and R3 (=2.7 KΩQ) were used in the voltage-divider configuration shown in FIG. 9. Dummy devices (resistors: 1 MΩ, 2 MΩ) were tested at 1000 V, 2000V, and 3000 V for calibration.

Based on this assumption, the following equations can be used for the calculation of the current and voltage of EC cooling device:

$$I_{EC} = V_{Ch1}/R3$$

$$V_{EC} = (V_{Ch2}/R2)R1 + R2) - V_{Ch1}.$$

Here $V_{Ch1}$ and $Ch_2$ are the reading of Channel 1 and Channel 2 of the oscilloscope. $I_{EC}$ is the current of the device, and $V_{EC}$ is the voltage of the device.

(viii) Heat Flux Under Different Applied Electric Fields

Figure 10:
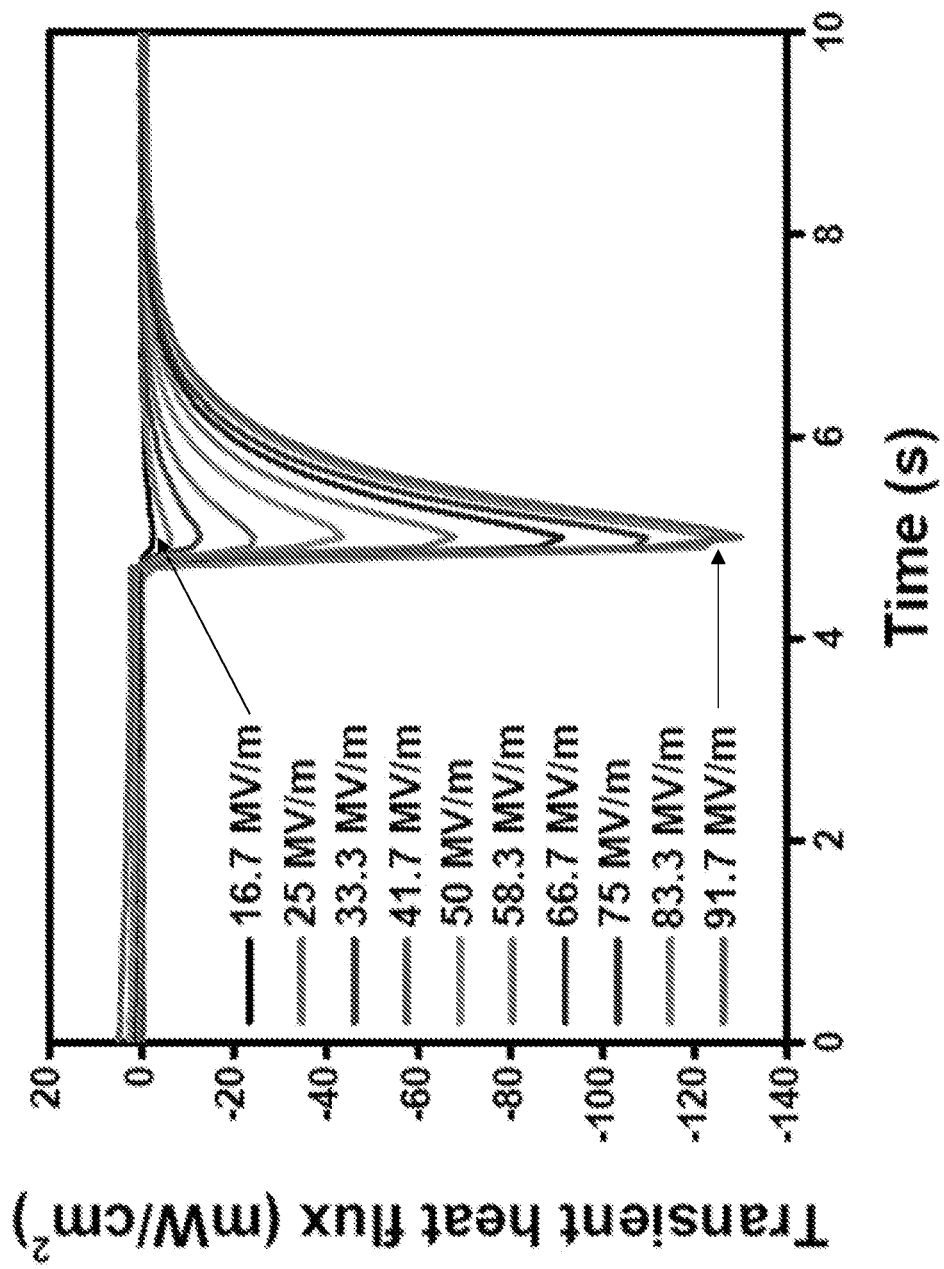
FIG. 10. Heat transport as a function of applied voltage on EC polymer film with frequency of 0.05 Hz.

FIG. 10 shows heat transport as a function of the applied voltage on the EC film. 111.3 mJ/cm2 of heat was moved in each cycle under a maximum applied voltage of 91.7 MV/m and a frequency of 0.05 Hz.

2. Second Example

FIG. 11 illustrates an alternative to S-shaped actuation comprising a device 1100 wherein curved surfaces 1102a, 1102b ensure good thermal contact when a flexible electrocaloric polymer layer 1104 is electrostatically attracted to the surface 1102a, 1102b and oscillates 1106 back and forth between the curved surfaces 1102a, 1102b. In this example, the device 1100 includes an electrocaloric polymer 1104 (including a single layer o stack) attached to flexible electrodes 1108, a source 1110 of cold or heat (cold source or heat source) having a curved surface 1112, a heat sink 1114 having a curved surface 1116, a first electrode 1118 on the curved surface 1112 of the cold source, a second electrode 1120 on the curved surface 1116 of heat sink 1114, a first insulator 1122 on the first electrode 1118, and a second insulator 1124 on the second electrode 1120. The heat transporting element 1150 may comprise the EC polymer 1104 alone or the EC polymer 1104 combined with electrode(s) 1108.

FIGS. 12(a) and 12(b) illustrate a single-sided example (air is the other side) wherein a wooden tongue depressor 1200 provides mass needed to stretch the EC film 1202 and ensure good contact when the electrostatic forces are applied and released. A spring or mass attached to the free end can adjust the frequency. Bending stiffness of the EC stack can also tune the frequency.

3. Third Example

FIG. 13 illustrates tiling individual EC heat pump tiles 1300 comprising EC layer(s) (e.g., 102b) or EC material 1304, or stacks 1302 (e.g., 116) including EC material 1304 and an electrode, as described herein to achieve surface conformation, redundancy, and increased reliability.

FIG. 14 illustrates interfacial material 1400 (straight or curved or flexible) interfacing with heat sinks and added to one or both sides of each heat pump tile 1300. sink. Here we have a heat sink that sinks the heat to the air.

FIG. 15 illustrates an example wherein the EC heat pump elements 1302 are stacked to form a stack 1500 and create larger temperature gradients. In one example, the tiles 1300 illustrated in FIG. 13 each include the stack 1500 including such stacked elements 1302.

More generally, the examples disclosed herein illustrate a solid-state heat transporting device 1306, comprising a heat transporting element (e.g., the EC material (e.g., film) 1304) whose uniformity of contact with one or multiple surfaces 1308, 128 (e.g., on a heat sink or heat source) is controllable (using electrostatic forces applied using electrodes) such that various amounts of heat may be transported to and from the one or multiple surfaces 1308. As described herein, the heat transporting element uses the electrocaloric effect to absorb and release the heat.

While the device can be used in a heating or cooling system, other device examples include using the heat transporting element as a thermal switch, as described below.

Second Embodiment: Switch Structure

FIGS. 16A-16D illustrate a controllable thermal conductivity switch 1600 or structure between two surfaces A and B. Each surface A and B is a surface of an insulating or semi-conducting dielectric layer 1602 on an electrode 1604a, 1604b, wherein the dielectric layer 1602 is between a moving piece 1606 and the electrode 1604a, 1604b. The moving piece comprises a substrate 1608 (a thermally conductive material comprising a heat transporting element 1608a) and a flexible electrode 1610 on the substrate. In one or more examples, the thermally conductive material may be a thin piece of metal or a sheet of graphite for example. In one or more examples, a dielectric coating may be applied to the sheet in order to allow for the proper electrostatic clamping and actuation. The coating may also serve to ruggedize the material to prevent wear and fatigue. Voltages applied between the electrodes 1604a, 1604b on the surfaces A. B and the flexible electrode 1610 generate electrostatics 1612 used to move the moving piece between the surfaces A and B, thereby changing or switching the effective thermal resistance between the surfaces A and B.

The switch may be considered a "metamaterial" where electrostatics are used to control the switch's thermal conductivity.

FIG. 16A illustrates the low thermal conductivity state of the switch 1600 wherein the high thermal conductivity element 1608 is not in contact with both surfaces A,B. FIG. 16B shows the high thermal conductivity state of the switch wherein the high thermal conductivity element forms contact with both surfaces A and B.

FIGS. 16C-16D illustrate an embodiment comprising multiple switches 1600 between the surfaces A and B. Multiple switches can afford greater changes in thermal conductivity FIG. 16C is the low thermal conductivity state and FIG. 16D is a low thermal conductivity state.

Process Steps

Figure 17:
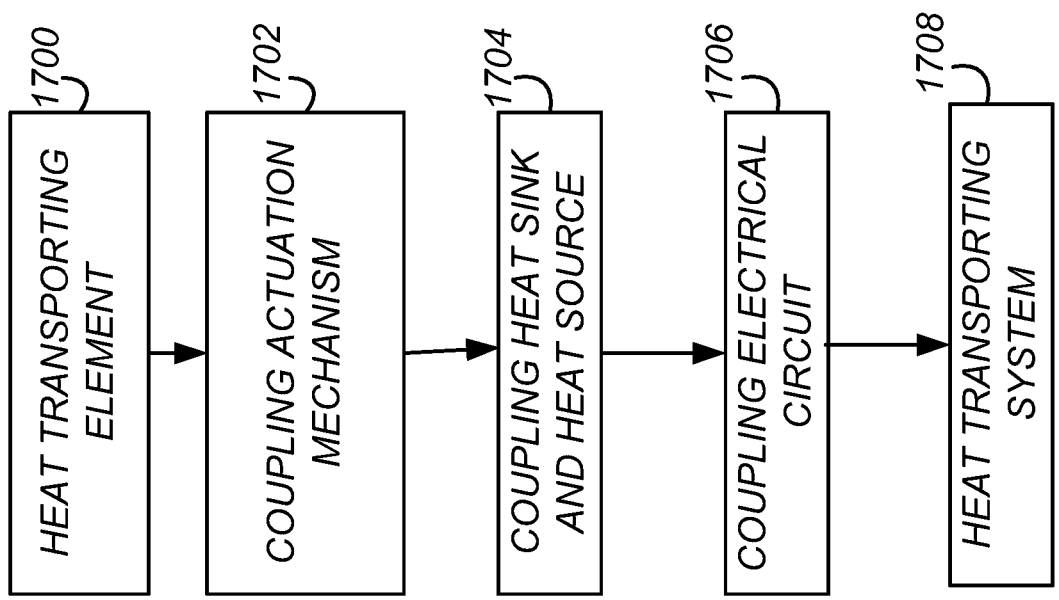
FIG. 17 is a flowchart illustrating a method of fabricating a heat transporting device.

FIG. 17 is a flowchart illustrating a method of fabricating a solid-state heat transporting device 100, 1306, 1600 (referring also to FIG. 1, FIG. 3, FIG. 8, and FIGS. 13-16).

Block 1700 represents providing a heat transporting element or member 102, 1608a, 1150 whose uniformity of contact with one or multiple surfaces 128,1102a, 1102b is controllable so that various amounts of heat H may be transported to and/or from the one or multiple surfaces 128,1102a, 1102b, 1308, A, B.

In one or more examples, the step comprises providing tiles 1300 each including one or more of the heat transporting elements 1302, 102. One or more of the tiles 1300 may cover and conform to one or more of the surfaces 1308.

In one or more examples, the heat transporting element 102, 1302 comprises an electrocaloric material 1304 that absorbs or releases the heat as a function of an electric field applied across the electrocaloric material.

Block 1702 represents coupling an actuation mechanism 104, 1152 to, or providing on an actuation mechanism on, the heat transporting element 102, 1608a. In one or more examples, the actuation mechanism includes one or more electrodes 1108, 110a, 110b, 110c wherein the uniformity of contact is controlled using an electrostatic force generated between the one or more multiple surfaces 128, 1308, 1102a, 1102b, A, B and the heat transporting element 1608a, 102, 1150 when an electrostatic field is applied between the electrode 1108, 110a, 110b, 110c and the one or multiple surfaces A, B, 1102a, 1102b.

In various examples, the actuation mechanism includes a pair of flexible electrodes 1108, and the flexible EC polymer (e.g., film) 1104 is attached between a pair of flexible electrodes 1108, so that an electric field can be applied between the pair of the flexible electrodes 1108.

In one or more examples, the heat transporting element 1608a, 1150 creates or eliminates thermal contact between two of the multiple surfaces A, B, 1102a, 1102b when the heat transporting element 1608a, 1150 is electrostatically controlled using the electrode(s) 1108.

In one or more examples, the electrostatic force changes a shape of the heat transporting element 1150, 1608a.

Block 1704 represents optionally coupling or attaching the actuation mechanism 104, 1152 to a heat sink 111, 1114 and a heat source 115 or cold source 1110. In various examples, the actuation mechanism 104 includes a flexible electrode 110a, 110b, 110c, 1108 attached to the flexible EC material, film, or layer 102b, 1104, a first electrode 108a, 1120 attached to the heat sink 111, 1114 and a second electrode 1120, 108b attached to the heat source 115 or cold source 1110.

Block 1706 represents optionally coupling a circuit 300 controlling timing of an electric field with respect to an actuation field. The flexible EC film 102b or heat transporting element bends when the actuation mechanism 104 applies a first voltage V1 causing actuation field $E_{act}$ between the flexible electrode 110a, 110b and the first electrode 108a or between the flexible electrode 110a, 110b and the second electrode 108b. The flexible EC film 102b or heat transporting element heats up through an electrocaloric effect to form a temperature gradient between the heat sink 111, 1114 (or the layer 112 attached to heat sink) and the flexible EC film 102b or heat transporting element when a second voltage V2 causes an electric field Ec to be applied across the flexible EC film 102b.

Block 1708 represents the end result, a heat transporting device or system 100, 1100, 1600, 1306.

The heat transporting device or system can be embodied in many ways, including but not limited to, the following:

1. The device including a solid state cooling device 100, 1306, 1100 comprising a flexible EC material (e.g., film) 1104, 102b, 1304; and an actuation mechanism 104, 1152 coupled to the flexible EC film 1104, 102b, 1304. The actuation mechanism bends the flexible EC film between a first thermal contact C1 with heat sink 111, 1114 or a layer 112 coupled to heat sink and a second thermal contact C2 with a heat source 1110 or a layer/interfacial material 114 coupled to heat source, so as to transfer heat H between the heat source 115 and the heat sink 111.

2. The device of embodiment 1, wherein the actuation mechanism 104, 1152 includes one or more flexible electrodes 110c, 110a, 110b, 1108 attached to the flexible EC film 102b, 1104, a first electrode 108a, 1120 attached to heat sink 111, 1114 or the layer 112 coupled to heat sink, and a second electrode 108b, 1120 attached to heat source 115, 1110 or the layer 114 coupled to heat source. The flexible EC film 102b bends when the actuation mechanism 104 applies an actuation field Eact between one or more of the flexible electrodes 110a, 110b and the first electrode 108a or between the one or more flexible electrodes 110a, 110b and the second electrode 108b, the flexible EC film 102b heats up through an electrocaloric effect to form a temperature gradient between the heat sink 111, 1114 or interfacial material 112 coupled to heat sink and the flexible EC film 102b when an electric field Ec is applied across at least a portion of the flexible EC film 102b, and heat H, inputted into the flexible EC film 102b through the second thermal contact C2, flows to the heat sink under the temperature gradient and through the first thermal contact C1.

3. The device of one or any combination of embodiments 1-2, wherein the flexible EC film 1104 is attached between a pair of flexible electrodes 1108 and an electric field Ec is applied between the pair of the flexible electrodes 1108.

4. The device of one or any combination of embodiments 1-3, further including the circuit 300 controlling timing of the electric field Ec with respect to the actuation field Eact such that the flexible EC film 1108 oscillates 1196 between the first thermal contact C1 and the second thermal contact C2, the flexible EC film 1104, 102b heats up through the electrocaloric effect when the flexible EC film 1104, 102b has the first thermal contact C1 with the heat sink 1114, and the flexible EC film 1104, 102b cools down when the flexible EC film 1104, 102b has the second thermal contact C2 with the heat source 1110.

5. The device of one or any combination of the preceding embodiments 1-4, wherein the flexible EC film 102b, 1104 has a thickness T in a range of 1-1000 micrometers, the flexible EC film 102b, 1104 has an active surface area A in a range of 5 millimeters (mm) by 5 mm to 10 centimeters (cm) by 10 cm or in a range of 5 mm by 5 mm to 1 meter (in) by 1 m, the actuation field Eact comprises an electric field having a frequency in a range of 0.01 Hz-10 Hz and a magnitude below a breakdown field of the EC polymer film, and the device has specific cooling power of at least 2.8 W/g and a coefficient of performance (COP) of at least 13.

6. The device of one or any combination of the embodiments 1-5, wherein one or more of the electrodes 110a, 110b, 110c, 1108, 108a, 108b comprise nanowires having a diameter in a range of 1-100 nm.

7. The device of one or any combination of the embodiments 1-6, wherein one or more of the electrodes 110a, 110b, 110c, 1108, 108a, 108b include nanowires comprising carbon nanotubes, metal nanowires, or a combination thereof.

8. The device of one or any combination of the embodiments 1-7, wherein the flexible electrodes 110a, 110b, 110c, 1108 comprise nanowires embedded in the flexible EC film 102b, 1104.

9. The device of one or any combination of the embodiments 1-8, wherein the flexible EC film 102b, 1104 comprises a polymer.

10. The device of one or any combination of the embodiments 1-9, wherein the flexible EC film 102b, 1104 comprises Vinylidene fluoride-trifluoroethylene-chlorofluoroethylene terpolymer (P(VDF-TrFE-CFE)). It should be noted that other co-polymers of PVDF (Vinylidene fluoride) have good properties and this invention should not be limited by the particular electrocaloric polymer. In fact, embodiments of the invention may work with thin layers of electrocaloric ceramics as well. Thus, embodiments of the present invention can use a variety of electrocaloric materials which can be operated using electrostatics as described herein 11. The device of one or any combination of the embodiments 1-10, wherein the flexible EC film 102b has a crystallinity characterized by a peak having a FWHM of less than 1 degree as measured by X-ray diffraction.

12. A switch 1600, comprising a first electrode 1604a coupled to a first surface A; a flexible structure 1606 thermally contacting the first surface A, the flexible structure 1606 comprising a flexible electrode 1610 on a thermally conductive material 1608c; a second electrode 1604b coupled to a second surface B, wherein the flexible structure 1606 bends to thermally contact the second surface B when a potential difference is applied between the flexible electrode 1610 and the second electrode 1604b, and the flexible structure 1606 bends so as to release from the second surface B when a potential difference is applied between the first electrode 1604a and the flexible electrode 1610.

13. The switch of embodiment 12, wherein the thermally conductive material comprises graphene, graphene oxide, carbon nanotubes, boron nitride, nanoparticles of boron nitride, graphite, nanoparticles of graphite, nanoparticles of a metal, and/or crystalline polymer fibers.

14. The switch of embodiment 12, wherein the thermally conductive material 1608 comprises nanoparticles such as nanocrystals, nanofibers, nanowires, nanoribbons, and nanoflowers.

15. The switch 1600 of one or any combination of embodiments 12-14 combined with the device of one or any combination of embodiments 1-11, wherein the actuation mechanism 104, 1152 of one or any combination of embodiments 1-1 includes the first electrode 1604a, the flexible structure 1606, and the second electrode 1604b of one or any combination of embodiments 12-14.

16. A solid-state heat transporting device 100, 1100, 1306, 1600 comprising a heat transporting element 102, 1150, 1608a whose uniformity of contact with one or multiple surfaces 128, 1102a, 1102b, A, B is controllable so that various amounts of heat H may be transported to and/or from the one or multiple surfaces 128, 1102a, 1102b, A,B.

17. The device of embodiment 16, wherein the heat transporting element 102, 1150, 1608a comprises an electrocaloric material 1104, 102b that absorbs or releases the heat as a function of an electric field Ec applied across the electrocaloric material 1104, 102*b*.

18. The device of one or any combination of the embodiments 16-17, further including an electrode 110*c*, 110*a*, 110*b*, 1108, 1610 on the heat transporting element 102, wherein the uniformity of contact C1, C2 is controlled using an electrostatic force generated between one of the surfaces 128, 1102*a*, 1102*b*, A, B and the heat transporting element 102, 1150 when an electrostatic field Eact is applied between the electrode 110*c*, 110*a*, 110*b*, 1108, 1610 and the one of the surfaces.

19. The device of one or any combination of the embodiments 16-18, wherein the electrostatic force changes a shape of the heat transporting element 102, 1150.

20. The device of one or any combination of the embodiments 16-19, wherein the solid-state heat transporting device 100, 1100 is conformable to a flat surface 128 or a non-flat surface 1102*a*.

21. The device of one or any combination of the embodiments 16-20, further comprising an electrode 1610 on the heat transporting element 1608*a*, wherein the heat transporting element 1608*a* creates or eliminates thermal contact C1, C2 between two of the multiple surfaces A, B when the heat transporting element 1608*a* is electrostatically controlled using the electrode 1610.

22. The device of one or any combination the embodiments 16-21, wherein the heat transporting element 1608*a*, 102, 1150 is an EC film.

23. A heat transporting system 1450 comprising tiles 1300 each including a heat transporting element 1302 of one or any combination of embodiments 16-22. The heat transporting element has a uniformity of contact with one or multiple surfaces that is controllable so that various amounts of heat may be transported to and/or from the one or multiple surfaces. One or more of the tiles cover and conform to one or more of the surfaces.

24. The device of one or any combination of the embodiments 16-23 combined with one or any combination of embodiments 1-11. The heat transporting element 102 is the flexible EC film and the heat transporting element is coupled to the actuation mechanism 104, 1152 of one or any combination of embodiments 1-11.

25. The device of one or any combination of the embodiments 16-23 combined with one or any combination of embodiments 12-15, wherein the heat transporting element 1608*a* comprises the thermally conductive material of one or any combination of elements 12-15.

26. The device of one or any combination of the embodiments 1-25, further comprising solid sheets on a top and bottom of the device, wherein a motion of the electrocaloric material in response to the electrostatic forces provides a pumping effect when the solid sheets on a top and bottom of the device contain holes allowing for motion of air or liquid.

In one or more examples, the light weight of the EC polymer stack enables electrostatic forces to rapidly transport the EC polymer stack while promoting intimate thermal contact between the EC material and the heat source/heat sink. In one or more examples, the high COP, high heat flux, compact and flexible form factor operation enable applications in wearable and mobile devices where current active cooling technologies are unsuitable.

Further information on one or more embodiments of the present invention can be found in reference 35.

REFERENCES

The following references are incorporated by reference herein.

1. X. Li, thesis, The Pennsylvania State University (2013).
2. T. Correia, Q. Zhang, (Eds.), Electrocaloric Materials: NewGeneration of Coolers. Springer Berlin Heidelberg (2014).
3. P. Hawken, Ed., *Drawdown: The Most Comprehensive Plan Ewr Proposed to Reverse Global Warming* (Penguin Books, 2017).
4. J. W. Peeples, Vapor Compression Cooling for High Performance Applications, *Electronics Cooling Magazine* 7, 16-24 (2001).
5. I. Chowdhury, R. Prasher, K. Lofgreen, G. Chrysler, S. Narasimhan, R. Mahajan, D. Koester, R. Alley, R. Venkatasubramanian, On-chip cooling by superlattice-based thin-film thermoelectrics. *Nat Nanotechnol* 4, 235-238 (2009).
6. A. S. Mischenko, Q. Zhang, J. F. Scott, R. W. Whatmore, N. D. Mathur, Giant electrocaloric effect in thin-film $PbZr_{0.95}Ti_{0.05}O_3$. *Science* 311, 1270-1271 (2006).
7. B. Neese, B. Chu, S.-G. Lu, Y. Wang, E. Furman, Q. M. Zhang, Large electrocaloric effect in ferroelectric polymers near room temperature. *Science* 321, 821-823 (2008).
8. Q. Li, G. Z. Zhang, X. S. Zhang, S. L. Jiang, Y. K. Zeng, Q. Wang, Relaxor Ferroelectric-Based Electrocaloric Polymer Nanocomposites with a Broad Operating Temperature Range and High Cooling Energy. *Adv Mater* 27, 2236-2241 (2015).
9. Y. Jia, Y. S. Ju, A solid-state refrigerator based on the electrocaloric effect. *Appi Phys Lett* 100, 242901 (2012).
10. R. I. Epstein, K. J. Malloy, Electrocaloric devices based on thin-film heat switches. *J Appl Phys* 106, 064509 (2009).
11. Y. S. Ju, Solid-State Refrigeration Based on the Electrocaloric Effect for Electronics Cooling. *J Electron Packaging* 132, 041004 (2010).
12. Y. V. Sinyavsky, V. M Brodyansky, Experimental Testing of Electrocaloric Cooling with Transparent Ferroelectric Ceramic as a Working Body. *Ferroelectrics* 131, 321-325 (1992).
13. H. M. Gu, X. S. Qian, X. Y. Li, B. Craven, W. Y. Zhu, A. L. Cheng, S. C. Yao, Q. M. Zhang, A chip scale electrocaloric effect based cooling device. *Appl Phys Lett* 102, 122904 (2013).
14. U. Plaznik, A. Kitanovski, B. Rozic, B. Malic, H. Ursic, S. Drnovsek, J. Cilensek, M. Vrabelj, A. Poredos, Z. Kutnjak, Bulk relaxor ferroelectric ceramics as a working body for an electrocaloric cooling device. *Appl Phys Lett* 106, 043903 (2015).
15. Y. D. Wang, S. J. Smullin, M. J. Sheridan, Q. Wang, C. Eldershaw, D. E. Schwartz, A heat-switch-based electrocaloric cooler. *Appl Phys Let* 107, 134103 (2015).
16. M. Ožbolt, A. Kitanovski, J. Tušek, A. Poredos, Electrocaloric refrigeration: Thermodynamics, state of the art and future perspectives. Int. J. Refrig. 40, 174-188 (2014). doi:10.1016/j.ijrefrig.2013.11.007
17. S. Jacobs, J. Auringer, A. Boeder, J. Chell, L. Komorowski, J. Leonard, S. Russek, C. Zimm, The performance of a large-scale rotary magnetic refrigerator. *Int. J. Refrig* 37, 84-91 (2014).
18. J. Tušek, K. Engelbrecht, D. Eriksen, S. Dall'Olio, J. Tušek, N. Pryd, A regenerative elastocaloric heat pump. Nature Energy 1, 16134 (2016). doi:10.1038/nenergy.2016.134
19. Q. Gao, B. F. Yu, C. F. Wang, B. Zhang, D. X. Yang, Y. Zhang, Experimental investigation on refrigeration performance of a reciprocating active magnetic regenerator of room temperature magnetic refrigeration. *Int J Refrig* 29, 1274-1285 (2006).
20. P. Clot, D. Viallet, F. Allab, A. Kedous-Lebouc, J. M. Fournier, J. P. Yonnet, A magnet-based device for active magnetic regenerative refrigeration. *IEEE T Magn* 39, 3349-3351 (2003).
21. T. Okamura, R. Rachi, N. Hirano, S. Nagaya. Improvement of 100 W class room temperature magnetic refrigerator. In *Proc. of 2 nd International Conference on Magnetic Refrigeration at Room Temperature*, 281-288 (2007).
22. C. Zimm, J. Auringer, A. Boeder, J. Chell, S. Russek, A. Sternberg. Design and initial performance of a magnetic refrigerator with a rotating permanent magnet. In *Proceedings of the 2 nd International conference of magnetic refrigeration at room temperature*, Portoroz, Slovenia, 341-347 (2007).
23. N. Hirano, S. Nagaya, M. Takahashi, T. Kuriyama, K. Ito, S. Nomura, Development of magnetic refrigerator for room temperature application. *Aip Conf Proc* 613, 1027-1034 (2002).
24. C. Zimm, A. Jastrab, A. Sternberg, V. Pecharsky, K. Gschneidner, M. Osborne, I. Anderson, Description and performance of a near-room temperature magnetic refrigerator. *Adv Cryog Eng* 43, 1759-1766 (1998).
25. J. A. Lozano, K. Engelbrecht, C. R. H. Bahl, K. K. Nielsen, D. Eriksen, U. L. Olsen, J. R. Barbosa, A. Smith, A. T. Prata, N. Pryds, Performance analysis of a rotary active magnetic refrigerator. *Appl Energ* 111, 669-680 (2013).
26. A. Tura, A. Rowe, Permanent magnet magnetic refrigerator design and experimental characterization. *Int J Refrig* 34, 628-639 (2011).
27. R. Ma, S. Kwon, Q. Zheng, H. Y. Kwon, J. I. Kim, H. R. Choi, S. Baik, Carbon-Nanotube/Silver Networks in Nitrile Butadiene Rubber for Highly Conductive Flexible Adhesives. *Adv Mater* 24, 3344-3349 (2012).
28. W. Yuan, L. B. Hu, Z. B. Yu, T. L. Lam, J. Biggs, S. M. Ha, D. J. Xi, B. Chen, M. K. Senesky, G. Gruner, Q. B. Pei, Fault-tolerant dielectric elastomer actuators using single-walled carbon nanotube electrodes. *Adv Mater* 20, 621-625 (2008).
29. S2. L. Engel, S. Kruk, J. Shklovsky, Y. Shacham-Diamand, S. Krylov, A study toward the development of an electromechanical poly(vinylidene fluoride-trifluoro-ethylenechlorofluoroethylene) buckling membrane actuator. *J Micromech Microeng* 24, 125027 (2014).
30. K. Sato, M. Shikida, An Electrostatically Actuated Gas Valve with an S-Shaped Film Element. *J Micromech Microeng* 4, 205-209 (1994).
31. R. Pelrine, R. Kornbluh, Q. B. Pei, J. Joseph, High-speed electrically actuated elastomers with strain greater than 100%. *Science* 287, 836-839 (2000).
32. S.-G. Lu and Q. Zhang, Electrocaloric Materials for Solid-State Refrigeration, *Adv Mater* 21, 1983-1987 (2009)
33. D. Campolo, M. Sitti, R. S. Fearing. *Efficient charge recovery method for driving piezoelectric actuators with quasi-square waves*. IEEE Trans. Ultrason. Ferroelectr. Freq. Control 50. 237-244 (2003). doi: 10.11097UFFC.2003.1193617pmid:12699157
34. S. X. Qian, D. Nasuta, A. Rhoads, Y. Wang, Y. L. Geng, Y. H. Hwang, R Rademacher, I. Takeuchi, *Not-in-kind cooling technologies: A quantitative comparison of refrigerants and system performance*. Int. J. Refrig. 62, 177-192 (2016). doi:10.1016j. ijrefrig.2015.10.019
35. Highly efficient electrocaloric cooling with electrostatic actuation, by Rujun Ma, Ziyang Zhang, Kwing Tong, David Huber, Roy Kornbluh, Yongho Sungtaek Ju DOI: 10.1126/science.aan5980, Science Vol. 357, No. 6356, and supporting information.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:
1. A solid-state heat transporting device, comprising:
a first electrode attached to a heat sink;
a first dielectric layer on the first electrode;
a second electrode attached to a heat source;
a second dielectric layer on the second electrode;
a heat transporting element comprising an electrocaloric material, a first end, and a second end, and a third electrode;
a first spacer between the first dielectric layer and the second dielectric layer and positioned so that the first end is mounted between the first spacer and the first dielectric layer;
a second spacer between the first dielectric layer and the second dielectric layer and positioned so that the second end is mounted between the second spacer and the second dielectric layer, and wherein:
the heat transporting element has an uniformity of contact with a first surface of the first dielectric layer or a second surface of the second dielectric layer and the uniformity of contact is controllable so that various amounts of heat are transported to the heat sink or from the heat source using an electrostatic force; and
the electrostatic force is generated between the first electrode or the second electrode and the third electrode when an electrostatic field is applied between the third electrode and the first electrode or the second electrode.
2. The device of claim 1, wherein:
the heat transporting element comprises a fourth electrode and a fifth electrode between the third electrode and the fourth electrode; and
the electrocaloric material that absorbs or releases the heat as a function of an electric field applied across the electrocaloric material using the fourth electrode, the fifth electrode, and the third electrode.
3. The device of claim 2, wherein the third electrode and the fourth electrode are connected to form a common cathode and the fifth electrode comprises an anode.
4. The device of claim 2 comprising:
a solid state cooling device further comprising:
an actuation mechanism coupled to the heat transporting element comprising a flexible EC film, wherein the actuation mechanism bends the flexible EC film between a first thermal contact with the heat sink and a second thermal contact with the heat source, so as to transfer heat between the heat source and the heat sink, and
the actuation mechanism includes the first electrode, the second electrode, a voltage source, and flexible electrodes comprising the third electrode, the fourth electrode, and the fifth electrode, the flexible EC film bends when the voltage source applies the electrostatic field between the at least one of the flexible electrodes and the first electrode or between the at least one of the flexible electrodes and the second electrode, the flexible EC film heats up through an electrocaloric effect to form a temperature gradient between the heat sink and the flexible EC film, when the electric field is applied across the flexible EC film between the fifth electrode and the third electrode and between the fifth electrode and the fourth electrode, and the heat, inputted into the flexible EC film through the second thermal contact, flows to the heat sink under the temperature gradient and through the first thermal contact.

5. The device of claim 4, further comprising a circuit controlling timing of the electric field with respect to the electrostatic field so that:

the flexible EC film oscillates between the first thermal contact and the second thermal contact, the flexible EC film heats up through the electrocaloric effect when the flexible EC film has the first thermal contact with the heat sink, and the flexible EC film cools down when the flexible EC film has the second thermal contact with the heat source.

6. The device of claim 4, wherein:

the flexible EC film has a thickness in a range of 1-1000 micrometers, the flexible EC film has an active surface area in a range of 5 mm by 5 mm to 10 cm by 10 cm, the electrostatic field comprises an electric field having a frequency in a range of 0.01 Hz—10 Hz and a magnitude below a breakdown field of the flexible EC film comprising an EC polymer film, and the device has specific cooling power of at least 2.8 W/g and a coefficient of performance (COP) of at least 13.

7. The device of claim 4, wherein the electrodes comprise nanowires having a diameter in a range of 1-100 nm.

8. The device of claim 7, wherein the nanowires comprise carbon nanotubes, metal nanowires, or a combination thereof.

9. The device of claim 7, wherein the flexible electrodes comprise the nanowires embedded in the flexible EC film.

10. The device of claim 4, wherein the flexible EC film comprises a terpolymer.

11. The device of claim 10, wherein the terpolymer comprises Vinylidene fluoride-trifluoroethylene-chlorofluoroethylene terpolymer (P(VDF-TrFE-CFE)).

12. The device of claim 4, wherein the flexible EC film has a crystallinity characterized by a peak having a FWHM of less than 1 degree as measured by X-ray diffraction.

13. The device of claim 1, wherein the electrostatic force changes a shape of the heat transporting element and the electrocaloric material comprises a terpolymer.

14. The device of claim 1, wherein the solid-state heat transporting device is conformable to a flat surface or a non-flat surface.

15. A heat transporting system comprising a tile including the heat transporting element of claim 1.

16. The device of claim 1, wherein the heat transporting element further comprises a flexible electrocaloric (EC) film attached between a pair of flexible electrodes including the third electrode, wherein the EC film absorbs or releases heat in response to an electric field applied between the pair of the flexible electrodes.

17. A switch, comprising:

a first surface and a second surface and a heat transporting element switching thermal conductivity between:

a high thermal conductivity state wherein the heat transporting element forms contact with both the first surface and the second surface at the same time, and a low thermal conductivity state wherein the heat transporting element is in contact only with the first surface;

the switch further comprising:

a first electrode coupled to the first surface;

the heat transporting element comprising a flexible electrode on a thermally conductive material; and a second electrode coupled to the second surface, wherein:

the heat transporting element bends to thermally contact the second surface when a first potential difference is applied between the flexible electrode and the second electrode, and the heat transporting element bends so as to release from the second surface when a second potential difference is applied between the first electrode and the flexible electrode.

18. The switch of claim 17, wherein the thermally conductive material comprises a terpolymer.

* * * * *